(12) United States Patent
Sato et al.

(10) Patent No.: US 10,456,841 B2
(45) Date of Patent: Oct. 29, 2019

(54) SURFACE-COATED CUTTING TOOL IN WHICH HARD COATING LAYERS EXHIBITS EXCELLENT CHIPPING RESISTANCE

(71) Applicant: MITSUBISHI MATERIALS CORPORATION, Tokyo (JP)

(72) Inventors: Kenichi Sato, Naka (JP); Sho Tatsuoka, Naka (JP); Kenji Yamaguchi, Naka (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 218 days.

(21) Appl. No.: 15/557,784

(22) PCT Filed: Mar. 11, 2016

(86) PCT No.: PCT/JP2016/057745
§ 371 (c)(1),
(2) Date: Sep. 12, 2017

(87) PCT Pub. No.: WO2016/148056
PCT Pub. Date: Sep. 22, 2016

(65) Prior Publication Data
US 2018/0071830 A1    Mar. 15, 2018

(30) Foreign Application Priority Data

Mar. 13, 2015 (JP) .................................. 2015-050644
Mar. 3, 2016 (JP) .................................. 2016-041383

(51) Int. Cl.
*B32B 27/14* (2006.01)
*B23B 27/14* (2006.01)
(Continued)

(52) U.S. Cl.
CPC .............. *B23B 27/14* (2013.01); *C23C 16/34* (2013.01); *C23C 16/347* (2013.01); *C23C 16/36* (2013.01);
(Continued)

(58) Field of Classification Search
USPC ........... 51/307, 309; 428/325, 689, 698, 699
See application file for complete search history.

(56) References Cited

U.S. PATENT DOCUMENTS 7,767,320 B2 * 8/2010 Endler .................... C23C 16/34
428/697
2005/0129986 A1 * 6/2005 Sata .................... C23C 14/0641
428/698

(Continued)

FOREIGN PATENT DOCUMENTS

EP         2823923 A    1/2015
JP    2004-058217 A    2/2004
(Continued)

OTHER PUBLICATIONS

Extended European Search Report dated Jul. 12, 2018 for the corresponding European Patent Application No. 16764886.4.
(Continued)

*Primary Examiner* — Archene A Turner
(74) *Attorney, Agent, or Firm* — Leason Ellis LLP

(57) ABSTRACT

A coated tool includes a hard coating layer that is formed with a (Ti,Al)(C,N) layer on its surface, the layer including an upper layer where a periodic compositional variation in Ti and Al is present in crystal grains having an NaCl type face-centered cubic structure, and a lower layer where a periodic compositional variation in Ti and Al is not present. The upper layer has a high Al amount, while the lower layer has a low Al amount. A value of I(200)/I(111) of the upper layer is greater than 10 and that of the lower layer is less than
(Continued)

3. The lower layer has a composition inclined structure where the Al amount increases from a tool body side towards an upper layer side. The lower layer contains multiple layers, where the Al amount of each layer can increase from the tool body side towards the upper layer side.

10 Claims, 4 Drawing Sheets

(51) Int. Cl.

| | | |
|---|---|---|
| *C23C 16/34* | (2006.01) | |
| *C23C 16/36* | (2006.01) | |
| *C23C 28/04* | (2006.01) | |
| *C23C 28/00* | (2006.01) | |
| *C23C 16/40* | (2006.01) | |
| *C23C 30/00* | (2006.01) | |
| *C23C 16/455* | (2006.01) | |

(52) U.S. Cl.
CPC ...... *C23C 16/403* (2013.01); *C23C 16/45523* (2013.01); *C23C 28/042* (2013.01); *C23C 28/044* (2013.01); *C23C 28/42* (2013.01); *C23C 30/005* (2013.01); *B23B 2228/105* (2013.01)

(56) References Cited

U.S. PATENT DOCUMENTS

| | | |
|---|---|---|
| 2009/0123779 A1 | 5/2009 | Endler |
| 2010/0323176 A1 | 2/2010 | Van Den Berg et al. |
| 2010/0233511 A1* | 9/2010 | Endler .................. C23C 16/029 428/698 |
| 2011/0003126 A1 | 1/2011 | Van Den Berg et al. |
| 2011/0081539 A1* | 4/2011 | Ni ....................... C23C 14/0641 51/307 |
| 2012/0201615 A1* | 8/2012 | Ni ....................... C23C 14/0641 428/698 |
| 2012/0219789 A1* | 8/2012 | Endler .................... C23C 16/34 428/335 |
| 2015/0158094 A1* | 6/2015 | Igarashi .................. C23C 16/36 428/336 |
| 2015/0217378 A1 | 8/2015 | Tatsuoka et al. |
| 2016/0040285 A1 | 2/2016 | Tatsuoka et al. |

FOREIGN PATENT DOCUMENTS

| | | |
|---|---|---|
| JP | 2008-545063 A | 12/2008 |
| JP | 2009-056540 A | 3/2009 |
| JP | 2011-513594 A | 4/2011 |
| JP | 2011-516722 A | 5/2011 |
| JP | 2011-224715 | * 11/2011 |
| JP | 2014-061588 A | 4/2014 |
| JP | 2014-128837 A | 7/2014 |
| JP | 2014-210333 A | 11/2014 |

OTHER PUBLICATIONS

International Search Report dated Apr. 12, 2016 for the corresponding PCT Application No. PCT/JP2016/057745.

* cited by examiner

SURFACE-COATED CUTTING TOOL IN WHICH HARD COATING LAYERS EXHIBITS EXCELLENT CHIPPING RESISTANCE

CROSS-REFERENCE TO RELATED PATENT APPLICATIONS

This application is a U.S. National Phase Application under 35 U.S.C. § 371 of International Patent Application No. PCT/JP2016/057745, filed Mar. 11, 2016, and claims the benefit of Japanese Patent Applications No. 2015-050644, filed Mar. 13, 2015, and No. 2016-041383, filed Mar. 3, 2016, all of which are incorporated herein by reference in their entireties. The International Application was published in Japanese on Sep. 22, 2016 as International Publication No. WO/2016/148056 under PCT Article 21(2).

FIELD OF THE INVENTION

The present invention relates to a surface-coated cutting tool (hereinafter, referred to as coated tool), in which a hard coating layer exhibits excellent chipping resistance during high-speed intermittent cutting work of carbon steel, cast iron, alloy steel or the like during which high-temperature heat is generated and impact loads are exerted on a cutting edge, and excellent cutting performance is exhibited during long-term use.

BACKGROUND OF THE INVENTION

Hitherto, in general, coated tools in which the surfaces of tool bodies made of tungsten carbide (hereinafter, referred to as WC)-based cemented carbide, titanium carbonitride (hereinafter, referred to as TiCN)-based cermet, or a cubic boron nitride (hereinafter, referred to as cBN)-based ultra-high-pressure sintered body (hereinafter, collectively referred to as a tool body) are coated with a Ti—Al-based complex nitride layer as a hard coating layer through a physical vapor deposition method are known, and it is known that these coated tools exhibit excellent wear resistance.

However, although the coated tool coated with the Ti—Al-based complex nitride layer in the related art has relatively excellent wear resistance, in a case of using the coated tool under high-speed intermittent cutting conditions, abnormal wear such as chipping easily occurs. Therefore, various suggestions for an improvement in the hard coating layer have been made.

For example, JP-A-2009-56540 discloses that a hard coating layer exhibits excellent fracture resistance even under high-speed intermittent cutting conditions, by depositing a hard coating layer which is formed of a layer of a complex nitride of Al and Ti satisfying a composition formula $(Al_xTi_{1-x})N$ (here, x is 0.40 to 0.65 in terms of atomic ratio) and showing a crystal alignment, in which, in a case where crystal orientation analysis is performed regarding the complex nitride layer by EBSD, an area proportion of crystal grains having crystal orientation <100> in a range of 0 to 15 degrees from a normal direction of a surface of a polished surface is 50% or higher, and in a case where an angle between adjacent crystal grains is measured, a proportion of a low angle grain boundary ($0<\theta\leq15°$) is 50% or higher, on a surface of a tool body.

However, in this coated tool, since the hard coating layer is deposited through the physical vapor deposition method, it is difficult to set the amount x of Al to be 0.65 or higher. Therefore, it is desired that cutting performance is further improved.

From such a viewpoint, a technology of forming a hard coating layer by a chemical vapor deposition method to increase the amount x of Al to approximately 0.9 has also been proposed.

For example, JP-T-2011-516722 describes that by performing chemical vapor deposition in a mixed reaction gas of $TiCl_4$, $AlCl_3$, and $NH_3$ in a temperature range of 650° C. to 900° C., a $(Ti_{1-x}Al_x)N$ layer in which the value of the amount x of Al is 0.65 to 0.95 can be deposited. However, this literature is aimed at further coating the $(Ti_{1-x}Al_x)N$ layer with an $Al_2O_3$ layer and thus improving a heat insulation effect. Therefore, the effects of the formation of the $(Ti_{1-x}Al_x)N$ layer in which the value of the amount x of Al is increased to 0.65 to 0.95 on cutting performance are not clear.

In addition, for example, JP-T-2011-513594 suggests that the heat resistance and fatigue strength of a coated tool are improved by coating a TiCN layer and an $Al_2O_3$ layer as inner layers with a $(Ti_{1-x}Al_x)N$ layer (x is 0.65 to 0.90 in terms of atomic ratio) having a cubic structure or a cubic structure including a hexagonal structure as an outer layer, and applying a compressive stress of 100 to 1100 MPa to the outer layer.

CITATION LIST

Technical Problem

There has been a strong demand for power saving and energy saving during cutting work in recent years. In accordance with this, there is a trend toward a further increase in speed and efficiency during cutting work. Therefore, abnormal damage resistance such as chipping resistance, fracture resistance, and peeling resistance is further required for a coated tool, and excellent wear resistance is required during long-term use.

However, in a coated tool described in JP-A-2009-56540, since the hard coating layer formed of a $(Ti_{1-x}Al_x)N$ layer is deposited through the physical vapor deposition method, it is difficult to increase the amount x of Al in the hard coating layer. Therefore, in a case where the coated tool is provided for high-speed intermittent cutting of carbon steel, cast iron, alloy steel or the like, there is a problem in that it cannot be said that wear resistance and chipping resistance are sufficient.

On the other hand, in the $(Ti_{1-x}Al_x)N$ layer deposited through the chemical vapor deposition method described in JP-T-2011-516722, the amount x of Al can be increased. In addition, since a cubic structure can be formed, a hard coating layer having a predetermined hardness and excellent wear resistance is obtained. However, there are problems in that the adhesion strength thereof to a tool body is insufficient and the toughness thereof may be deteriorated.

Furthermore, in the coated tool described in JP-T-2011-513594, although the coated tool has a predetermined hardness and excellent wear resistance, the toughness thereof is deteriorated. Therefore, in a case where the coated tool is provided for high-speed intermittent cutting work of carbon steel, cast iron, alloy steel or the like, there are problems in that abnormal damage such as chipping, fracture, and peeling easily occurs and it cannot be said that satisfactory cutting performance is exhibited.

Here, an object of the present invention is to provide a coated tool which has excellent toughness and exhibits excellent chipping resistance and wear resistance during long-term use even in a case of being provided for high-speed intermittent cutting of carbon steel, cast iron, alloy steel or the like.

SUMMARY OF THE INVENTION

Therefore, from the above-described viewpoints, the inventors intensively studied to improve the chipping resistance and wear resistance of a coated tool in which a hard coating layer containing at least a layer of a complex nitride or complex carbonitride of Ti and Al (hereinafter, sometimes referred to as "(Ti,Al)(C,N)" or "$(Ti_{1-x}Al_x)(C_yN_{1-y})$") is formed. As a result, the following knowledge was obtained.

First, the inventors made an attempt to improve chipping resistance of a hard coating layer by setting the hard coating layer formed of (Ti,Al)(C,N) having an NaCl type face-centered cubic structure to have at least a two-layer structure having different Al amounts. A (Ti,Al)(C,N) layer which is a lower layer, having the Al amount relatively lower than that of a (Ti,Al)(C,N) layer which is an upper layer, has high adhesion strength thereof to a tool body and excellent peeling resistance. Meanwhile, since the (Ti,Al)(C,N) layer which is an upper layer has a relatively higher Al amount, excellent wear resistance is obtained, but it cannot be said that chipping resistance is sufficient due to a decrease in toughness.

Here, the inventors have proceeded the studies, and found that, in (Ti,Al)(C,N) crystal grains of the upper layer having the relatively high Al amount, having an NaCl type face-centered cubic structure, a periodic compositional variation is formed in the crystal grains, and thus, a decrease in toughness of the upper layer is prevented, and as a result, the upper layer has excellent wear resistance and excellent chipping resistance.

That is, the inventors have found that, by configuring the hard coating layer formed of (Ti,Al)(C,N) having an NaCl type face-centered cubic structure to have at least a two-layer structure of the upper layer having a relatively high Al amount and the lower layer having a relatively lower Al amount, and forming the periodic compositional variation in the (Ti,Al)(C,N) crystal grains of the upper layer, the hard coating layer has excellent toughness and wear resistance, exhibits excellent chipping resistance and wear resistance, even in a case of being provided for high-speed intermittent cutting work of carbon steel, cast iron, alloy steel or the like, and exhibits excellent cutting performance during a long-term use.

In addition, the inventors have studied regarding an X-ray diffraction peak intensity I(200) from a (200) plane of the (Ti,Al)(C,N) crystal grains and an X-ray diffraction peak intensity I(111) from a (111) plane thereof, and the inventors have found that, in a case where a value of I(200)/I(111) of the upper layer exceeds 10 and a value of I(200)/I(111) of the lower layer is smaller than 3, more excellent chipping resistance and wear resistance are exhibited.

Further, the inventors have found that, in a case where the Al amount of the lower layer is set to be gradually increased from a tool body side towards a hard coating layer surface side, or in a case where the lower layer is configured with a plurality of layers and the Al amount of each layer is set to be increased from the tool body side towards the hard coating layer surface side, peeling resistance is even more improved.

The present invention is made based on the above-described knowledge and is characterized by including "(1) a surface-coated cutting tool in which a hard coating layer is formed on a surface of a tool body made of any of tungsten carbide-based cemented carbide, titanium carbonitride-based cermet, and a cubic boron nitride-based ultra-high-pressure sintered body, in which (a) the hard coating layer includes at least a layer of a complex nitride or complex carbonitride of Ti and Al, having an average layer thickness of 1 to 20 μm, (b) the layer of a complex nitride or complex carbonitride includes at least a phase of a complex nitride or complex carbonitride having an NaCl type face-centered cubic structure, (c) the layer of a complex nitride or complex carbonitride includes at least an upper layer in which a periodic compositional variation in Ti and Al is present in crystal grains having an NaCl type face-centered cubic structure, and a lower layer in which a periodic compositional variation in Ti and Al is not present in crystal grains having an NaCl type face-centered cubic structure, (d) in a case where the upper layer is expressed by the composition formula: $(Ti_{1-x}Al_x)(C_yN_{1-y})$, an average amount $X_{avg}$ of Al in the total amount of Ti and Al and an average amount $Y_{avg}$ of C in the total amount of C and N (both $X_{avg}$ and $Y_{avg}$ are atomic ratios) respectively satisfy $0.70 \leq X_{avg} \leq 0.95$ and $0 \leq Y_{avg} \leq 0.005$, and (e) in a case where the lower layer is expressed by the composition formula: $(Ti_{1-u}Al_u)(C_vN_{1-v})$, an average amount $U_{avg}$ of Al in the total amount of Ti and Al and an average amount $V_{avg}$ of C in the total amount of C and N (both $U_{avg}$ and $V_{avg}$ are atomic ratios) respectively satisfy $0 \leq U_{avg} < 0.70$ and $0 \leq V_{avg} \leq 0.005$.

(2) The surface-coated cutting tool described in (1), in which, in a case where an X-ray diffraction peak intensity from a (200) plane of crystal grains of the upper layer having an NaCl type face-centered cubic structure is set as I(200) and an X-ray diffraction peak intensity from a (111) plane of crystal grains of the upper layer having an NaCl type face-centered cubic structure is set as I(111), I(200)/I(111) >10 is satisfied.

(3) The surface-coated cutting tool described in (1) or (2), in which, in a case where an X-ray diffraction peak intensity from a (200) plane of crystal grains of the lower layer having an NaCl type face-centered cubic structure is set as I(200) and an X-ray diffraction peak intensity from a (111) plane of crystal grains of the lower layer having an NaCl type face-centered cubic structure is set as I(111), I(200)/I(111)<3 is satisfied.

(4) The surface-coated cutting tool described in any one of (1) to (3), in which, a composition gradient is present in the lower layer, and an amount u of Al in the lower layer in the total amount of Ti and Al gradually increases from a tool body surface side towards an upper layer side.

(5) The surface-coated cutting tool described in any one of (1) to (3), in which, the lower layer is configured with a plurality of layers having different compositions, and an amount u of Al of each layer in the total amount of Ti and Al increases from a tool body side towards an upper layer side.

(6) The surface-coated cutting tool described in any one of (1) to (5), in which, in the crystal grains of the upper layer having an NaCl type face-centered cubic structure in which a periodic compositional variation in Ti and Al is present, a difference Δx between the average of local maximums of x which varies periodically and the average of local minimums of x is 0.03 to 0.25.

(7) The surface-coated cutting tool described in any one of (1) to (6), in which, in the crystal grains of the upper layer having an NaCl type face-centered cubic structure in which the periodic compositional variation in Ti and Al is present, the periodic compositional variation in Ti and Al is present along one orientation among the equivalent crystal orientations expressed by <001> of the crystal grains, a period along the orientation is 3 to 100 nm, and a change in an amount Xo of Al in a total amount of Ti and Al in a plane perpendicular to the orientation is 0.01 or less.

(8) The surface-coated cutting tool described in any one of (1) to (7), in which, regarding the upper layer, in a case where the layer is observed in a longitudinal sectional direction, in grain boundaries of the crystal grains having an NaCl type face-centered cubic structure in the layer, fine crystal grains having a hexagonal structure are present, an area proportion of the fine crystal grains present is 5% or lower by area, and an average grain size R of the fine crystal grains is 0.01 to 0.3 µm.

(9) The surface-coated cutting tool described in any one of (1) to (8), in which, between the tool body and the lower layer, a base layer which is formed of a Ti compound layer that includes one layer or two or more layers of a Ti carbide layer, a Ti nitride layer, a Ti carbonitride layer, a Ti oxycarbide layer, and a Ti oxycarbonitride layer and has an average total layer thickness of 0.1 to 20 µm is present.

(10) The surface-coated cutting tool described in any one of (1) to (9), in which an outermost surface layer which includes at least an aluminum oxide layer having an average total layer thickness of 1 to 25 µm is present on a surface of the upper layer."

The present invention will be described below in detail.

The hard coating layer of the coated tool of the present invention includes at least the (Ti,Al)(C,N) layer expressed by the composition formula: $(Ti_{1-x}Al_x)(C_yN_{1-y})$. The (Ti,Al)(C,N) layer has high hardness and excellent wear resistance, and the effect thereof is significantly exhibited particularly in a case where the average layer thickness thereof is 1 to 20 µm. The reason for this is that, in a case where the average layer thickness thereof is smaller than 1 µm, the layer thickness thereof is too small to sufficiently ensure wear resistance during long-term use, and in a case where the average layer thickness thereof is greater than 20 µm, the crystal grains of the layer of a complex nitride or complex carbonitride of Ti and Al are likely to coarsen and chipping easily occurs. Therefore, the average layer thickness thereof was selected to be 1 to 20 µm. In addition, it is preferable that, in a case where an average layer thickness of the lower layer of the hard coating layer of the present invention is 0.3 to 1.5 µm, adhesion strength is further improved and chipping resistance is even more improved.

FIGS. 1A-1C show examples of a sectional schematic view of the hard coating layer of the coated tool of the present invention.

As shown in FIGS. 1A to 1C, the hard coating layer of the present invention includes at least an upper layer in which a periodic compositional variation in Ti and Al is present in crystal grains having an NaCl type face-centered cubic structure, and a lower layer in which a periodic compositional variation in Ti and Al is not present in crystal grains having an NaCl type face-centered cubic structure, and examples of a typical aspect of the lower layer include a case where the lower layer has a substantially uniform composition over the entire lower layer, as shown in FIG. 1A, a case where the lower layer has a composition inclined structure in which the Al amount in the layer continuously increases from the tool body surface side towards the upper layer side, as shown in FIG. 1B, and a case where the lower layer is configured to have a layered structure formed of a plurality of layers and, in the layered structure, each of the Al amount of the plurality of layers gradually and stepwisely increases from the tool body side towards the upper layer side, as shown in FIG. 1C.

Here, in a case where the upper layer is expressed by the composition formula: $(Ti_{1-x}Al_x)(C_yN_{1-y})$, the composition thereof is controlled such that the average amount $X_{avg}$ of Al in the total amount of Ti and Al and the average amount $Y_{avg}$ of C in the total amount of C and N (both $X_{avg}$ and $Y_{avg}$ are atomic ratios) respectively satisfy $0.70 \leq X_{avg} \leq 0.95$ and $0 \leq Y_{avg} \leq 0.005$.

The reason for this is that, in a case where the average amount $X_{avg}$ of Al is less than 0.70, oxidation resistance of the (Ti,Al)(C,N) layer deteriorates. Therefore, in a case of being provided for high-speed intermittent cutting of alloy steel or the like, wear resistance is not sufficient. On the other hand, in a case where the average amount $X_{avg}$ of Al is more than 0.95, the amount of precipitated hexagonal crystals having deteriorated hardness increases, the hardness is decreased, resulting in a decrease in wear resistance. Therefore, the average amount $X_{avg}$ of Al was selected to be $0.70 \leq X_{avg} \leq 0.95$.

When the average amount $Y_{avg}$ of the component C contained in the (Ti,Al)(C,N) layer is small amount in a range of $0 \leq Y_{avg} \leq 0.005$, the lubricity thereof is improved and thus an impact during cutting is relieved, resulting in an improvement in chipping resistance and fracture resistance of the (Ti,Al)(C,N) layer. On the other hand, when the average amount $Y_{avg}$ of the component C is outside of the range of $0 \leq Y_{avg} \leq 0.005$, the toughness of the (Ti,Al)(C,N) layer decreases and thus, chipping resistance and fracture resistance decrease, which is not preferable. Therefore, the average amount $Y_{avg}$ of C was selected to be $0 \leq Y_{avg} \leq 0.005$.

The amount of C excludes an unavoidable amount of C which is included even though gas containing C is not intentionally used as a gas raw material, and a value obtained by subtracting the unavoidable amount of C was selected to be $Y_{avg}$.

In addition, in a case where the lower layer is expressed by the composition formula: $(Ti_{1-u}Al_u)(C_vN_{1-v})$, the composition thereof is controlled such that the average amount $U_{avg}$ of Al in the total amount of Ti and Al and the average amount $V_{avg}$ of C in the total amount of C and N (both $U_{avg}$ and $V_{avg}$ are atomic ratios) respectively satisfy $0 \leq U_{avg} < 0.70$ and $0 \leq V_{avg} \leq 0.005$.

The reason for this is that, in a case where the average amount $U_{avg}$ of Al is less than 0.70, the (Ti,Al)(C,N) layer has excellent adhesion strength thereof to the tool body or a base layer coated on the tool body, and exhibits excellent peeling resistance, during high-speed intermittent cutting work during which impact and mechanical loads are exerted on a cutting edge, and on the other hand, in a case where the average amount $U_{avg}$ of Al is equal to or greater than 0.70, wear resistance is improved, but peeling resistance tends to decrease.

Therefore, the average amount $U_{avg}$ of Al of the lower layer was selected to be $0 \leq U_{avg} < 0.70$.

In the same manner as in the case of the average amount $Y_{avg}$ of the component C of the upper layer, when the average amount $V_{avg}$ of the component C contained in the lower layer is a small amount in a range of $0 \leq V_{avg} \leq 0.005$, the lubricity thereof is improved and thus an impact during cutting is relieved, resulting in an improvement in chipping resistance and fracture resistance, but when the average amount $V_{avg}$ of the component C is outside of the range of $0 \leq V_{avg} \leq 0.005$, the toughness of the (Ti,Al)(C,N) layer decreases and thus, chipping resistance and fracture resistance decrease, which is not preferable. Therefore, the average amount $Y_{avg}$ of C of the lower layer was selected to be $0 \leq V_{avg} \leq 0.005$.

When X-ray diffraction was respectively performed on the upper layer and the lower layer using Cu-Kα radiation as a radiation source, as shown in FIG. 2, in a case where an X-ray diffraction peak intensity from a (200) plane of crystal grains of the upper layer having an NaCl type face-centered cubic structure is set as I(200) and an X-ray diffraction peak intensity from a (111) plane of crystal grains of the upper layer having an NaCl type face-centered cubic structure is set as I(111), I(200)/I(111)>10 is desirably satisfied. In such a case, the upper layer has excellent hardness, and as a result, excellent wear resistance is exhibited.

As shown in FIG. 2, in a case where the crystal grains of the lower layer having an NaCl type face-centered cubic structure satisfy I(200)/I(111)<3, the lower layer exhibits excellent toughness, and as a result, excellent chipping resistance and peeling resistance are exhibited.

As shown in FIG. 3, in a case where the lower layer has an inclined composition structure in which the Al amount from the tool body side towards the upper layer side gradually and continuously increases, the X-ray diffraction peak becomes a peak having a larger full width at half maximum, than that in FIG. 2, and I(200) and I(111) at this time are values of maximum intensities of the respective peaks.

As shown in FIG. 4, in a case where the lower layer is configured to have a layered structure formed of a plurality of (Ti,Al)(C,N) layers, and the Al amount of the (Ti,Al)(C,N) layer positioned on the upper layer side is relatively higher than that of the (Ti,Al)(C,N) layer positioned on the tool body side, the X-ray diffraction peaks appear in accordance with the number of layers configuring the lower layer, and I(200) and I(111) at this time are average values of maximum intensities of the respective peaks.

Since an Al amount of the lower layer is lower than an Al amount of the upper layer, the peak of the lower layer appears on a low angle side with respect to the upper layer, and from this relationship, the peaks of the lower layer and the upper layer can be identified.

The lower layer can be formed as a single (Ti,Al)(C,N) layer satisfying the composition formula: $(Ti_{1-u}Al_u)(C_vN_{1-v})$ ($0 \leq U_{avg} < 0.70$ and $0 \leq V_{avg} \leq 0.005$).

In addition, the lower layer may not be a single layer and can be configured to have a layered structure in which a plurality of (Ti,Al)(C,N) layers are laminated. In this case, it is necessary that a component composition of each layer configuring the layered structure satisfies the composition formula: $(Ti_{1-u}Al_u)(C_vN_{1-v})$ ($0 \leq U_{avg} < 0.70$ and $0 \leq V_{avg} \leq 0.005$).

In a case where the lower layer is formed with a single (Ti,Al)(C,N) layer, the lower layer can be formed as a layer having a substantially uniform composition over the entire lower layer, and can also be formed as a single layer having a composition inclined structure in which the amount of Al in the total amount of Ti and Al gradually and continuously increases from the tool body side towards the upper layer side. In a case where the lower layer having such a composition inclined structure is formed, the lower layer has excellent adhesion strength to the tool body and the upper layer, and chipping resistance and peeling resistance are improved.

In a case where lower layer is configured to have a layered structure of the plurality of (Ti,Al)(C,N) layers, it is desired that the Al amount of the (Ti,Al)(C,N) layer positioned on the upper layer side is relatively higher than that of the (Ti,Al)(C,N) layer positioned on the tool body side and gradually and stepwisely increases. In such a case, the adhesion strength between the tool body and the lower layer, the adhesion strength between the lower layer and the upper layer, and the adhesion strength between the layers of the lower layer configured with the plurality of layers are excellent, and chipping resistance and peeling resistance are improved.

Both in a case of an inclined composition structure in which the Al amount from the tool body side towards the upper layer side gradually and continuously increases, and in a case where the lower layer is formed of a plurality of layers and the Al amount gradually and stepwisely increases, mismatch of crystal lattices is gradually relieved, and, therefore, adhesion is improved.

Regarding the crystal grains of the upper layer having an NaCl type face-centered cubic structure in which the periodic compositional variation in Ti and Al is present, strain occurs in the crystal grains due to the periodic compositional variation in Ti and Al present in crystal grains, resulting in an improvement in hardness. However, when the difference Δx between the average of local maximums of x and the average of local minimums thereof in the composition formula, which is an index of the degree of the compositional variation in Ti and Al, is smaller than 0.03, the degree of strain in the crystal grains described above is low, and a sufficient improvement in hardness cannot be expected. On the other hand, when the difference Δx between the average of the local maximums of x and the average of the local minimums thereof is greater than 0.25, the degree of strain in the crystal grains becomes too high, there are more lattice defects, and hardness decreases. Here, regarding the compositional variation in Ti and Al present in the crystal grains having an NaCl type face-centered cubic structure, the difference Δx between the average of the local maximums of x which varies periodically and the average of the local minimums thereof is desirably selected to be 0.03 to 0.25.

FIG. 5 shows an example of a graph showing a periodic compositional variation in Ti and Al obtained by acquiring the state of the compositional variation in Ti and Al present in the crystal grains, by performing line analysis by energy-dispersive X-ray spectroscopy (EDS) using a transmission electron microscope.

It is desired that the periodic compositional variation in Ti and Al of the crystal grains of the upper layer having an NaCl type face-centered cubic structure is present along one orientation among equivalent crystal orientations expressed by <001> of the crystal grains having an NaCl type face-centered cubic structure with a period of 3 to 100 nm. In a case where the period is less than 3 nm, toughness easily decreases, and on the other hand, in a case where the period is more than 100 nm, an effect of an improvement in hardness cannot be expected. In a case where the period present along one orientation among equivalent crystal orientations expressed by <001> of the crystal grains having an NaCl type face-centered cubic structure is 3 to 100 nm, chipping resistance is particularly improved.

In addition, by setting a change in an amount Xo of Al in a plane orthogonal to the orientation in a total amount of Ti and Al to be 0.01 or less, dislocation slip in a {001} plane at an angle with respect to the {110} plane is induced, resulting in an improvement in toughness.

FIG. 6 is a schematic view showing crystal grains in which the periodic compositional variation in Ti and Al is present, in which the periodic compositional variation is present along one orientation among equivalent crystal orientations expressed by <001> of the crystal grains, and the periodic compositional variation in Ti and Al in a plane orthogonal to the orientation is small.

In a case where the upper layer and the lower layer of the present invention are observed in the longitudinal sectional direction thereof using an field emission scanning electron microscope, fine crystal grains having a hexagonal structure may be present in grain boundaries of the individual crystal grains having an NaCl type face-centered cubic structure, and the presence of the small amount of fine crystal grains is allowed and the presence of the small amount of fine crystal grains is preferable from a viewpoint of an improvement in toughness.

That is, in a case where the small amount of fine crystal grains having a hexagonal structure is present, grain boundary sliding is suppressed, resulting in an improvement of toughness.

However, in a case where an area proportion of the fine crystal grains having a hexagonal structure is higher than 5% by area, the proportion of crystal grains having an NaCl type face-centered cubic structure is relatively decreased and thus hardness decreases. Therefore, the area proportion thereof is desirably is 5% or lower by area.

In a case where fine crystal grains having a hexagonal structure are present in grain boundaries of the crystal grains having an NaCl type face-centered cubic structure, in a case where an average grain size R is smaller than 0.01 μm, an effect of suppressing grain boundary sliding is insufficient. On the other hand, in a case where the average grain size R thereof is greater than 0.3 μm, strain in the layer increases and thus hardness decreases. Therefore, the average grain size R of the fine crystal grains having a hexagonal structure is desirably 0.01 to 0.3 μm.

The lower layer and the upper layer of the present invention can be formed by, for example, the following chemical vapor deposition method in which the composition of a reaction gas varies periodically on the surface of the tool body.

In a chemical vapor deposition reaction apparatus which is used, a gas group A of $NH_3$ and $H_2$ and a gas group B of $TiCl_4$, $AlCl_3$, $N_2$, and $H_2$ are supplied into the reaction apparatus from separate gas supply tubes, the supplying of the gas group A and the gas group B into the reaction apparatus is performed so that the gases are allowed to flow at time intervals of a predetermined period only for a shorter time than the period, the supplying of the gases of the gas group A and the gas group B has a phase difference of a time shorter than the time for which the gases are supplied, and the composition of the reaction gas on the surface of the tool body can be changed over time between (a) the gas group A, (b) a mixed gas of the gas group A and the gas group B, and (c) the gas group B. Moreover, in the present invention, there is no need to introduce a long-term exhaust process intended for strict gas substitution. Therefore, as a gas supply method, for example, it is possible to realize the composition of the reaction gas on the surface of the tool body being able to be changed over time between (a) a mixed gas primarily containing the gas group A, (b) a mixed gas of the gas group A and the gas group B, and (c) a mixed gas primarily containing the gas group B by rotating gas supply ports, rotating the tool body, or reciprocating the tool body.

Regarding the upper layer of the present invention, the (Ti,Al)(C,N) layer having a predetermined composition and a predetermined target layer thickness can be formed on the surface of the tool body by performing a thermal CVD method for a predetermined time, for example, using, as the composition of the reaction gas (% by volume with respect to the total amount of the gas group A and the gas group B), the gas group A of $NH_3$: 2.0% to 3.0%, and $H_2$: 65% to 75% and the gas group B of $AlCl_3$: 0.7% to 0.9%, $TiCl_4$: 0.2% to 0.3%, $N_2$: 0.0% to 12.0%, $C_2H_4$: 0% to 0.5%, and $H_2$: the remainder, under a reaction atmosphere pressure of 4.5 to 5.0 kPa, at a reaction atmosphere temperature of 700° C. to 750° C., and with a supply period of 3 to 4 seconds, a gas supply time of 0.15 to 0.25 seconds per one period, and a phase difference in supply between gas group A and gas group B of 0.10 to 0.20 seconds.

The upper layer having a relatively high Al amount and the lower layer having a relatively low Al amount of the present invention can be, for example, individually formed by adjusting a ratio between $AlCl_3$ and $TiCl_4$, a supply period, or a phase difference in supply between gas group A and gas group B, in the film forming method described above.

In addition, regarding the formation of the upper layer in which a compositional variation is formed in the crystal grains having an NaCl type face-centered cubic structure, the gas group A and the gas group B are supplied so that the times at which the gas group A and the gas group B arrive at the surface of the tool body are different from each other. Therefore, a difference in local composition of Ti and Al is formed in the crystal grains, atomic rearrangement occurs due to stabilization thereof, and a periodic compositional variation is formed.

As a result, an upper layer having excellent wear resistance and dramatically improved toughness is formed, and thus, even in a case of being used during high-speed intermittent cutting work during which an intermittent and impact loads are exerted on a cutting edge, the hard coating layer exhibits excellent chipping resistance and excellent cutting performance is exhibited during long-term use.

Base Layer and Outermost Surface Layer:

The (Ti,Al)(C,N) layer of the present invention exhibits sufficient effects in itself. However, the base layer which is formed of a Ti compound layer that includes one layer or two or more layers of a Ti carbide layer, a Ti nitride layer, a Ti carbonitride layer, a Ti oxycarbide layer, and a Ti oxycarbonitride layer, and has an average total layer thickness of 0.1 to 20 μm can be provided. The outermost surface layer including an aluminum oxide layer can be provided to have an average total layer thickness of 1 to 25 μm.

In a case where these layers are provided, even more excellent cutting performance is exhibited.

However, in a case of providing the base layer formed of a Ti compound layer that includes one layer or two or more layers of a Ti carbide layer, a Ti nitride layer, a Ti carbonitride layer, a Ti oxycarbide layer, and a Ti oxycarbonitride layer, and in a case where the average total layer thickness of the base layer is smaller than 0.1 μm, the effect of the base layer is insufficiently exhibited. On the other hand, in a case where the average total layer thickness thereof is greater than 20 μm, the crystal grains easily coarsen and chipping easily occurs.

In addition, in a case of providing the outermost surface layer including an aluminum oxide layer, and in a case where the average total layer thickness of the outermost surface layer is smaller than 1 μm, the effect of the outermost surface layer is insufficiently exhibited. On the other hand, in a case where the average total layer thickness thereof is greater than 25 μm, the crystal grains easily coarsen and chipping easily occurs.

Advantageous Effects of Invention

The hard coating layer of the present invention includes at least the (Ti,Al)(C,N) layer and the (Ti,Al)(C,N) layer is formed of at least the upper layer having a relatively high Al amount and a lower layer having a relatively low Al amount, and a periodic compositional variation is formed in the (Ti,Al)(C,N) crystal grains of the upper layer having an NaCl type face-centered cubic structure. Thus, the hard coating layer has excellent toughness and wear resistance, and therefore, even in a case of being provided for high-speed intermittent cutting work of carbon steel, cast iron, alloy steel or the like, excellent chipping resistance and wear resistance are exhibited.

In addition, when an X-ray diffraction peak intensity from a (200) plane of the (Ti,Al)(C,N) crystal grains of the hard coating layer having an NaCl type face-centered cubic structure is set as I(200) and an X-ray diffraction peak intensity from a (111) plane thereof is set as I(111), I(200)/I(111)>10 is satisfied in the upper layer, and I(200)/I(111)<3 is satisfied in the lower layer. Therefore, wear resistance of the upper layer and the chipping resistance and the peeling resistance of the lower layer can be further improved.

Furthermore, a composition inclined structure in which the Al amount gradually and continuously increases from the tool body side towards the upper layer side is formed in the lower layer, or the lower layer is configured to have a layered structure formed of a plurality of layers and each of the Al amount of the plurality of layers gradually and stepwisely increases from the tool body side towards the upper layer side. Therefore, adhesion strength between the tool body—lower layer—upper layer is improved and chipping resistance and peeling resistance can be even further improved.

The coated tool of the present invention in which the hard coating layer is coated on the surface of the tool body exhibits excellent chipping resistance and wear resistance and exhibits excellent cutting performance during a long-term use, even in a case of being provided for high-speed intermittent cutting work of carbon steel, cast iron, alloy steel or the like during which impact and mechanical loads are exerted on a cutting edge.

BRIEF DESCRIPTION OF DRAWINGS

These and other features and advantages of the present invention will become more readily appreciated when considered in connection with the following detailed description and appended drawing(s), wherein like designations denote like elements in the various views, and wherein.

DETAILED DESCRIPTION OF THE INVENTION

Figure 1A:
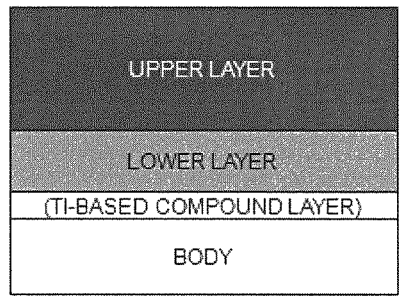
FIGS. 1A-1C show examples of a sectional schematic view of a hard coating layer of a coated tool of the present invention and show three types of typical aspects of a lower layer.
Figure 1B:
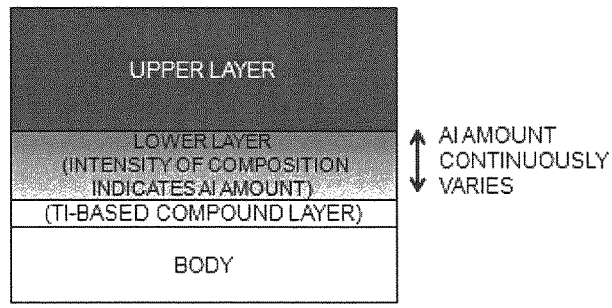
Figure 1C:
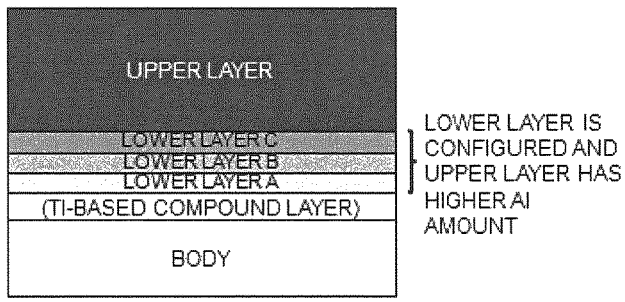
Figure 2:
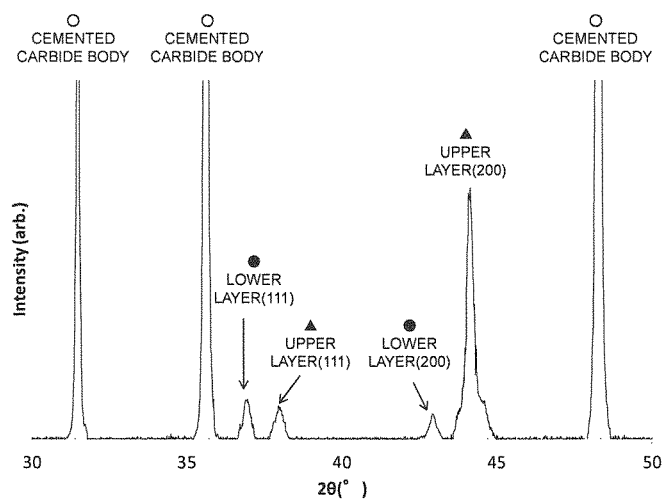
FIG. 2 shows an example of an X-ray diffraction chart of the coated tool of the present invention in which the lower layer is a single layer, and peak intensities I(111) and I(200) of the lower layer and an upper layer are respectively calculated.
Figure 3:
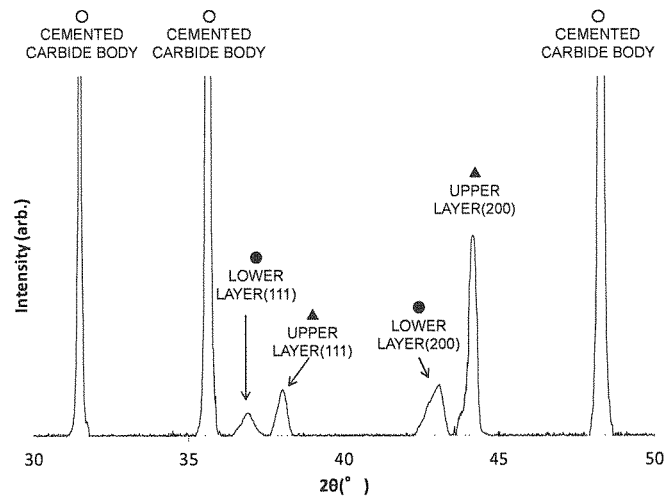
FIG. 3 shows an example of an X-ray diffraction chart of the coated tool of the present invention including a lower layer having an inclined composition structure in which an Al amount of the lower layer gradually and continuously increases from a tool body side towards an upper layer side, and peak intensities I(111) and I(200) of the lower layer and an upper layer are respectively calculated.
Figure 4:
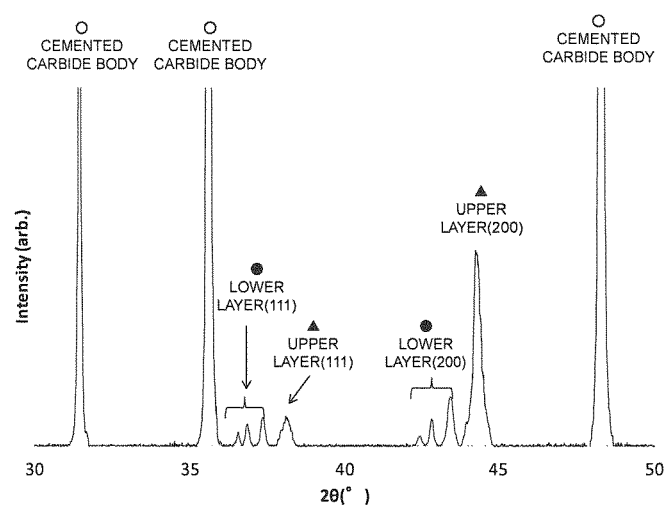
FIG. 4 shows an example of an X-ray diffraction chart of the coated tool of the present invention including a lower layer, in which the lower layer is configured to have a layered structure formed of a plurality of (Ti,Al)(C,N) layers, an Al amount of a (Ti,Al)(C,N) layer positioned on an upper layer side is relatively higher than that of a (Ti,Al)(C,N) layer positioned on a tool body side, and peak intensities I(111) and I(200) of the lower layer and the upper layer are respectively calculated.
Figure 5:
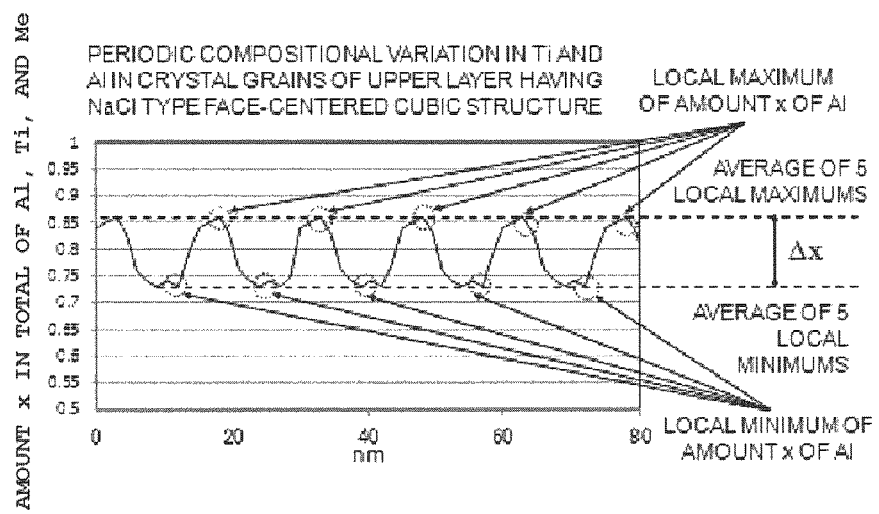
FIG. 5 shows an example of a graph of a periodic compositional variation in Ti and Al as a result of line analysis performed by energy-dispersive X-ray spectroscopy (EDS) using a transmission electron microscope on the crystal grains in which the periodic compositional variation in Ti and Al is present in the section of a (Ti,Al)(C,N) layer configuring the hard coating layer of the present invention and having an NaCl type face-centered cubic structure.
Figure 6:
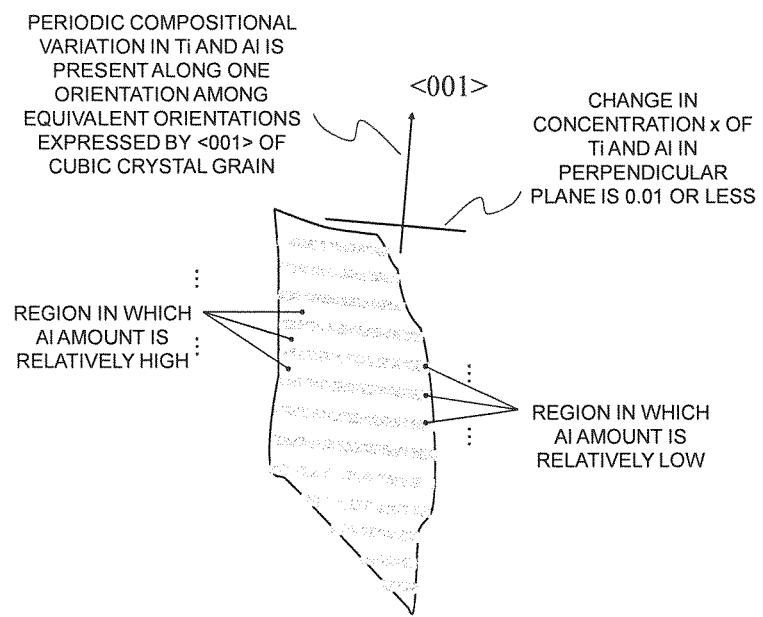
FIG. 6 is a schematic view schematically illustrating that, in crystal grains in which a periodic compositional variation in Ti and Al is present in the section of a (Ti,Al)(C,N) layer configuring the hard coating layer of the present invention and having an NaCl type face-centered cubic structure, the periodic compositional variation in Ti and Al is present along one orientation among equivalent crystal orientations expressed by <001> of the crystal grains, and the periodic compositional variation in Ti and Al in a plane orthogonal to the orientation is small.

Next, Examples of the coated tool of the present invention will be described in more detail.

Example 1

As raw material powders, a WC powder, a TiC powder, a TaC powder, an NbC powder, a $Cr_3C_2$ powder, and a Co powder, all of which had an average grain size of 1 to 3 μm, were prepared, and the raw material powders were mixed in mixing compositions shown in Table 1. Wax was further added thereto, and the mixture was blended in acetone by a ball mill for 24 hours and was decompressed and dried. Thereafter, the resultant was press-formed into green compacts having predetermined shapes at a pressure of 98 MPa, and the green compacts were sintered in a vacuum of 5 Pa at a predetermined temperature in a range of 1370° C. to 1470° C. for one hour. After the sintering, tool bodies A to C made of WC-based cemented carbide with insert shapes according to ISO standard SEEN1203AFSN were produced.

In addition, as raw material powders, a TiCN (TiC/TiN=50/50 in terms of mass ratio) powder, an $Mo_2C$ powder, a ZrC powder, an NbC powder, a WC powder, a Co powder, and an Ni powder, all of which had an average grain size of 0.5 to 2 μm, were prepared, and the raw material powders were mixed in mixing compositions shown in Table 2, were subjected to wet mixing by a ball mill for 24 hours, and were dried. Thereafter, the resultant was press-formed into green compacts at a pressure of 98 MPa, and the green compacts were sintered in a nitrogen atmosphere at 1.3 kPa at a temperature of 1500° C. for one hour. After the sintering, a tool body D made of TiCN-based cermet with insert shapes according to ISO standard SEEN1203AFSN was produced.

Next, a lower layer formed of a (Ti,Al)(C,N) having a substantially constant Al amount in the layer were deposited on the surfaces of the tool bodies A to D through a thermal CVD method for a predetermined time using a chemical vapor deposition apparatus, under forming conditions A1 to E1 shown in Table 4 and Table 5 in which a gas group A of $NH_3$ and $H_2$ and a gas group B of $TiCl_4$, $AlCl_3$, $N_2$, and $H_2$ were used and in each gas supply method, a reaction gas composition (% by volume with respect to the total amount of the gas group A and the gas group B) included a gas group A of NH$_3$: 0.5% to 1.0%, H$_2$: 65% to 75% and a group B of AlCl$_3$: 0.0% to 0.6%, TiCl$_4$: 0.3% to 0.7%, N$_2$: 0.0% to 12.0%, C$_2$H$_4$: 0% to 0.5%, H$_2$: the remainder, a reaction atmosphere pressure was 4.5 to 5.0 kPa, a reaction atmosphere temperature was 600° C. to 680° C., a supply period was 3 to 4 seconds, a gas supply time per one period was 0.15 to 0.25 seconds, and a phase difference in supply between gas group A and gas group B was 0.10 to 0.20 seconds.

Then, present invention coated tools 1 to 10 shown in Table 9 were produced by depositing an upper layer formed of (Ti,Al)(C,N) having a predetermined layer thickness on the surface of the lower layer, through a thermal CVD method for a predetermined time, under forming conditions A to G shown in Table 6 and Table 7 in which a gas group A of NH$_3$ and H$_2$ and a gas group B of TiCl$_4$, AlCl$_3$, N$_2$, and H$_2$ were used and in each gas supply method, a reaction gas composition (% by volume with respect to the total amount of the gas group A and the gas group B) included a gas group A of NH$_3$: 2.0% to 3.0%, H$_2$: 65% to 75% and a gas group B of AlCl$_3$: 0.7% to 0.9%, TiCl$_4$: 0.2% to 0.3%, N$_2$: 0.0% to 12.0%, C$_2$H$_4$: 0% to 0.5%, and H$_2$: the remainder, a reaction atmosphere pressure was 4.5 to 5.0 kPa, a reaction atmosphere temperature was 700° C. to 750° C., a supply period was 3 to 4 seconds, a gas supply time per one period was 0.15 to 0.25 seconds, and a phase difference in supply between gas group A and gas group B was 0.10 to 0.20 seconds.

In addition, the base layer and the outermost surface layer shown in Table 8 were formed on the present invention coated tools 4 to 8 under forming conditions shown in Table 3.

In addition, for the purpose of comparison, comparative coated tools 1 to 10 were produced by depositing the lower layers on the surfaces of the tool bodies A to D under forming conditions f1 to j1 shown in Table 4 and Table 5, and the upper layers including a (Ti,Al)(C,N) layer shown in Table 10 under the conditions of a comparative film forming process shown in Table 6 and Table 7.

Coated tools in which the lower layer is not provided as shown in Table 10 (comparative coated tools 1 to 5) or coated tools in which a hard coating layer is formed so as not to have a phase difference in supply between gas group A and gas group B during a film forming process of the (Ti$_{1-x}$Al$_x$)(C$_y$N$_{1-y}$) layer as shown in Table 7 (see D', E', I', and J') are provided.

In the same manner as the present invention coated tools 4 to 8, the base layer and the outermost surface layer shown in Table 8 were formed in the comparative coated tools 4 to 8 under the forming conditions shown in Table 3.

The section of each of the lower layer, the upper layer, the base layer, and the outermost surface layer of the present invention coated tools 1 to 10 and the hard coating layer (hereinafter, for convenience, the hard coating layer of the comparative coated tools 1 to 10 is also referred to as the upper layer), the base layer, and the outermost surface layer of the comparative coated tools 1 to 10 perpendicular to the tool body was measured using a scanning electron microscope (at a magnification of 5,000×). An average layer thickness was obtained by measuring and averaging the layer thicknesses of five points in an observation visual field. The results showed substantially the same average layer thicknesses as the target layer thicknesses shown in Tables 9 and 10.

Regarding the Al average amount U$_{avg}$ of the lower layer of the present invention coated tools 1 to 10, the average amount U$_{avg}$ was acquired by observing the lower layer by using the transmission electron microscope (at a magnification of 200,000×), and performing area analysis of the lower layer from the section side using energy-dispersive X-ray spectroscopy (EDS). In addition, regarding the average Al amount X$_{avg}$ of the upper layers of the present invention coated tools and the upper layers of the comparative coated tools 1 to 10, a sample of which the surface was polished using an electron probe micro-analyzer (EPMA) was irradiated with electron beams from the sample surface side, and the average amount X$_{avg}$ of Al was obtained by averaging 10 points of the analytic result of obtained characteristic X-rays. The average C amounts V$_{avg}$ and Y$_{avg}$ were obtained by secondary ion mass spectrometry (SIMS). Ion beams were emitted toward a range of 70 μm×70 μm from the sample surface side, and the concentration of components emitted by a sputtering action was measured in a depth direction. The average C amounts V$_{avg}$ and Y$_{avg}$ represent the average value in the depth direction of the (Ti,Al)(C,N) layer.

X-ray diffraction was performed on the lower layers and the upper layers of the present invention coated tools 1 to 10 and the upper layers of the comparative coated tools 1 to 10 using an X-ray diffraction apparatus and Cu-Kα radiation as a radiation source, an X-ray diffraction peak intensity from a (200) plane of (Ti,Al)(C,N) crystal grains having an NaCl type face-centered cubic structure is acquired as I(200), an X-ray diffraction peak intensity from a (111) plane was acquired as I(111), and a value of I(200)/I(111) was obtained. Each peak was investigated by confirming that diffraction peak appears in a diffraction angle (for example, angle regarding (111) is 36.66° to 38.53° and an angle regarding (200) is 43.59° to 44.77°) of the same crystal plane shown in each of JCPDS 00-038-1420 cubic TiN and JCPDS 00-046-1200 cubic AlN.

Furthermore, a small region of the (Ti,Al)(C,N) layer was observed by using the transmission electron microscope (at a magnification of 200,000×), and area analysis from the section side was performed using energy-dispersive X-ray spectroscopy (EDS). It was confirmed that a periodic compositional variation in Ti and Al was present in the composition formula: (Ti$_{1-x}$Al$_x$)(C$_y$N$_{1-y}$) in the (Ti,Al)(C,N) crystal grains configuring the upper layer of the present invention coated tools 1 to 10 and having an NaCl type face-centered cubic structure. Regarding the crystal grains, the magnification was set so that the compositional variation for approximately 10 periods from the intensity of the composition is in the measurement range based on the results of the area analysis, the line analysis using EDS was performed in the range for 5 periods along a normal direction of the surface of the tool body, a difference in average values of the local maximums and local minimums of the periodic compositional variation in Ti and Al was obtained as a difference Δx between the local maximum and local minimum, and an average interval of the 5 periods of the local maximums was obtained as a period of the periodic compositional variation in Ti and Al.

In addition, in the upper layers of the present invention coated tools 1 to 10, regarding a sample in which the periodic compositional variation in Ti and Al present along one orientation among equivalent crystal orientations expressed by <001> of the (Ti,Al)(C,N) crystal grains having an NaCl type face-centered cubic structure was confirmed, the line analysis using EDS along this orientation was performed in the range of 5 periods, a difference in average values of the local maximums and local minimums of the periodic compositional variation in Ti and Al was obtained as a difference □x between the local maximum and local minimum, an average interval of the 5 periods of the local maximums was obtained as a period of the periodic compositional variation in Ti and Al, the line analysis along a direction orthogonal to the orientation was performed, and a difference between the maximum and the minimum of an average amount XO of Al in a total amount of Ti and Al was obtained as a compositional variation in Ti and Al.

In a state where the section of the lower layer and the upper layers of the present invention coated tools 1 to 10 and the upper layers of the comparative coated tools 1 to 10 in the direction perpendicular to the surface of the tool body was polished as a polished surface, the polished surface was set in the body tube of a field emission scanning electron microscope, and an electron beam was emitted toward each of the crystal grains which were present in a measurement range of the polished section at an incident angle of 70 degrees with respect to an acceleration voltage of 15 kV and an emission current of 1 nA. Regarding the hard coating layer in a measurement range at a length of 100 μm in the direction parallel to the tool body in less than the layer thickness along the section in the direction perpendicular to the surface of the tool body, an electron backscatter diffraction image was measured using an electron backscatter diffraction apparatus at an interval of 0.01 μm/step. By analyzing the crystal structure of the individual crystal grains, an area proportion of fine crystal grains having a hexagonal structure that were formed in the grain boundaries of the crystal grains having an NaCl type face-centered cubic structure was measured, radii of circumscribed circles created with respect to respective the fine crystal grains were measured, and an average grain size R of fine crystal grains was set as an average value of the values of the radii.

Table 9 and Table 10 show the values obtained above.

TABLE 1

| | Type | Mixing composition (mass %) | | | | | |
|---|---|---|---|---|---|---|---|
| | | Co | TiC | TaC | NbC | $Cr_3C_2$ | WC |
| Tool body | A | 8.0 | 1.5 | — | 3.0 | 0.4 | Remainder |
| | B | 8.5 | — | 1.8 | 0.2 | — | Remainder |
| | C | 7.0 | — | — | — | — | Remainder |

TABLE 2

| | Type | Mixing composition (mass %) | | | | | | |
|---|---|---|---|---|---|---|---|---|
| | | Co | Ni | ZrC | NbC | $Mo_2C$ | WC | TiCN |
| Tool body | D | 8 | 5 | 1 | 6 | 6 | 10 | Remainder |

TABLE 3

| Constituent layers of hard coating layer | | | Forming conditions (pressure of reaction atmosphere is expressed as kPa and temperature is expressed as ° C.) | | |
|---|---|---|---|---|---|
| Type | Formation symbol | | Reaction gas composition (% by volume) | Reaction atmosphere Pressure | Temperature |
| $(Ti_{1-x}Al_x)(C_yN_{1-y})$ layer | TiAlCN | TiAlCN | See Table 6 | See Table 7 | See Table 7 |
| Ti compound layer | TiC | TiC | $TiCl_4$: 2%, $CH_4$: 10%, $H_2$: remainder | 7 | 850 |
| | TiN | TiN-① | $TiCl_4$: 4.2%, $N_2$: 30%, $H_2$: remainder | 30 | 780 |
| | | TiN-② | $TiCl_4$: 4.2%, $N_2$: 30%, $H_2$: remainder | 7 | 850 |
| | l-TiCN | l-TiCN-① | $TiCl_4$: 2%, $CH_3CN$: 0.7%, $N_2$: 10%, $H_2$: remainder | 7 | 850 |
| | | l-TiCN-② | $TiCl_4$: 2%, $CH_3CN$: 0.7%, $N_2$: 10%, $H_2$: remainder | 7 | 780 |
| | TiCNO | TiCNO | $TiCl_4$: 2%, $CH_3CN$: 0.7%, CO: 1%, $N_2$: 10%, $H_2$: remainder | 7 | 780 |
| $Al_2O_3$ layer | $Al_2O_3$ | $Al_2O_3$ | $AlCl_3$: 2.2%, $CO_2$: 5.5%, HCl: 2.2%, $H_2S$: 0.2%, $H_2$: remainder | 7 | 800 |

TABLE 4

| Formation of lower layer | | Forming conditions (reaction gas composition indicates proportion in total amount of gas group A and gas group B) | |
|---|---|---|---|
| Process type | Formation symbol | Reaction gas group A composition (% by volume) | Reaction gas group B composition (% by volume) |
| Present invention film forming process | A1 | $NH_3$: 0.5%, $H_2$: 70%, | $AlCl_3$: 0.3%, $TiCl_4$: 0.4%, $N_2$: 0%, $C_2H_4$: 0%, $H_2$ as remainder |
| | B1 | $NH_3$: 0.7%, $H_2$: 75%, | $AlCl_3$: 0.4%, $TiCl_4$: 0.3%, $N_2$: 0%, $C_2H_4$: 0.5%, $H_2$ as remainder |
| | C1 | $NH_3$: 1.0%, $H_2$: 65%, | $AlCl_3$: 0.1%, $TiCl_4$: 0.5%, $N_2$: 2%, $C_2H_4$: 0%, $H_2$ as remainder |
| | D1 | $NH_3$: 0.8%, $H_2$: 70%, | $AlCl_3$: 0.0%, $TiCl_4$: 0.7%, $N_2$: 0%, $C_2H_4$: 0%, $H_2$ as remainder |

TABLE 4-continued

Forming conditions (reaction gas composition indicates proportion in total amount of gas group A and gas group B)

| Process type | Formation of lower layer Formation symbol | Reaction gas group A composition (% by volume) | Reaction gas group B composition (% by volume) |
|---|---|---|---|
| | E1 | NH$_3$: 0.5%, H$_2$: 75%, | AlCl$_3$: 0.5%, TiCl$_4$: 0.3%, N$_2$: 7%, C$_2$H$_4$: 0%, H$_2$ as remainder |
| Comparative film forming process | a1 | NH$_3$: — %, H$_2$: — %, | AlCl$_3$: — %, TiCl$_4$: — %, N$_2$: — %, C$_2$H$_4$: — %, — %, |
| | b1 | NH$_3$: — %, H$_2$: — %, | AlCl$_3$: — %, TiCl$_4$: — %, N$_2$: — %, C$_2$H$_4$: — %, — %, |
| | c1 | NH$_3$: — %, H$_2$: — %, | AlCl$_3$: — %, TiCl$_4$: — %, N$_2$: — %, C$_2$H$_4$: — %, — %, |
| | d1 | NH$_3$: — %, H$_2$: — %, | AlCl$_3$: — %, TiCl$_4$: — %, N$_2$: — %, C$_2$H$_4$: — %, — %, |
| | e1 | NH$_3$: — %, H$_2$: — %, | AlCl$_3$: — %, TiCl$_4$: — %, N$_2$: — %, C$_2$H$_4$: — %, — %, |
| | f1 | NH$_3$: 0.4%, H$_2$: 70%, | AlCl$_3$: 0.9%, TiCl$_4$: 0.3%, N$_2$: 7%, C$_2$H$_4$: 0.5%, H$_2$ as remainder |
| | g1 | NH$_3$: 1.3%, H$_2$: 65%, | AlCl$_3$: 1.1%, TiCl$_4$: 0.2%, N$_2$: 15%, C$_2$H$_4$: 0%, H$_2$ as remainder |
| | h1 | NH$_3$: 0.6%, H$_2$: 62%, | AlCl$_3$: 0.0%, TiCl$_4$: 0.8%, N$_2$: 0%, C$_2$H$_4$: 0%, H$_2$ as remainder |
| | i1* | NH$_3$: 1.2%, AlCl$_3$: 0.7%, TiCl$_4$: 0.3%, N$_2$: 10%, C$_2$H$_4$: 10%, H$_2$ as remainder | |
| | j1 | NH$_3$: 0.9%, AlCl$_3$: 0.8%, TiCl$_4$: 0.3%, N$_2$: 0%, C$_2$H$_4$: 0%, H$_2$ as remainder | |

(Note)
Mark * indicates that gas is supplied under condition without a phase difference of any of the gas group A and the gas group B.

TABLE 5

Forming conditions (pressure of reaction atmosphere is expressed as kPa and temperature is expressed as ° C.)

| Formation of lower layer Process type | Formation symbol | Gas group A Supply period (sec) | Gas group A Supply time per one period (sec) | Gas group B Supply period (sec) | Gas group B Supply time per one period (sec) | Phase difference in supply between gas group A and gas group B (sec) | Reaction atmosphere Pressure | Reaction atmosphere Temperature |
|---|---|---|---|---|---|---|---|---|
| Present invention film forming process | A1 | 3.0 | 0.15 | 3.0 | 0.15 | 0.10 | 4.5 | 650 |
| | B1 | 4.0 | 0.25 | 4.0 | 0.25 | 0.15 | 5.0 | 600 |
| | C1 | 3.0 | 0.2 | 3.0 | 0.2 | 0.20 | 4.7 | 680 |
| | D1 | 3.5 | 0.2 | 3.5 | 0.2 | 0.15 | 4.5 | 600 |
| | E1 | 3.5 | 0.25 | 3.5 | 0.25 | 0.20 | 5.0 | 630 |
| Comparative film forming process | a1 | — | — | — | — | — | — | — |
| | b1 | — | — | — | — | — | — | — |
| | c1 | — | — | — | — | — | — | — |
| | d1 | — | — | — | — | — | — | — |
| | e1 | — | — | — | — | — | — | — |
| | f1 | 5.0 | 0.3 | 5.0 | 0.3 | 0.30 | 5 | 600 |
| | g1 | 2.0 | 0.10 | 2.0 | 0.10 | 0.05 | 6 | 680 |
| | h1 | 3.0 | 0.15 | 3.0 | 0.15 | 0.15 | 4.7 | 750 |
| | i1 | — | — | — | — | — | 5 | 550 |
| | j1 | — | — | — | — | — | 3.5 | 650 |

TABLE 6

Forming conditions (reaction gas composition indicates proportion in total amount of gas group A and gas group B)

| Process type | Formation of upper layer Formation symbol | Reaction gas group A composition (% by volume) | Reaction gas group B composition (% by volume) |
|---|---|---|---|
| Present invention film forming process | A | NH$_3$: 3.0%, H$_2$: 68%, | AlCl$_3$: 0.7%, TiCl$_4$: 0.3%, N$_2$: 6%, C$_2$H$_4$: 0%, H$_2$ as remainder |
| | B | NH$_3$: 2.5%, H$_2$: 73%, | AlCl$_3$: 0.8%, TiCl$_4$: 0.2%, N$_2$: 0%, C$_2$H$_4$: 0%, H$_2$ as remainder |
| | C | NH$_3$: 2.5%, H$_2$: 75%, | AlCl$_3$: 0.9%, TiCl$_4$: 0.3%, N$_2$: 0%, C$_2$H$_4$: 0.5%, H$_2$ as remainder |
| | D | NH$_3$: 3.0%, H$_2$: 70%, | AlCl$_3$: 0.9%, TiCl$_4$: 0.2%, N$_2$: 3%, C$_2$H$_4$: 0%, H$_2$ as remainder |
| | E | NH$_3$: 2.0%, H$_2$: 72%, | AlCl$_3$: 0.7%, TiCl$_4$: 0.2%, N$_2$: 0%, C$_2$H$_4$: 0.5%, H$_2$ as remainder |
| | F | NH$_3$: 2.5%, H$_2$: 69%, | AlCl$_3$: 0.9%, TiCl$_4$: 0.3%, N$_2$: 7%, C$_2$H$_4$: 0%, H$_2$ as remainder |
| | G | NH$_3$: 2.5%, H$_2$: 68%, | AlCl$_3$: 0.7%, TiCl$_4$: 0.2%, N$_2$: 11%, C$_2$H$_4$: 0%, H$_2$ as remainder |
| Comparative film forming process | A' | NH$_3$: 2.0%, H$_2$: 69%, | AlCl$_3$: 1.4%, TiCl$_4$: 0.2%, N$_2$: 0%, C$_2$H$_4$: 0%, H$_2$ as remainder |
| | B' | NH$_3$: 2.5%, H$_2$: 60%, | AlCl$_3$: 0.8%, TiCl$_4$: 0.3%, N$_2$: 4%, C$_2$H$_4$: 1.0%, H$_2$ as remainder |
| | C' | NH$_3$: 1.5%, H$_2$: 73%, | AlCl$_3$: 0.9%, TiCl$_4$: 0.1%, N$_2$: 0%, C$_2$H$_4$: 0.5%, H$_2$ as remainder |
| | D' | NH$_3$: 2.0%, AlCl$_3$: 0.7%, TiCl$_4$: 0.6%, N$_2$: 15%, C$_2$H$_4$: 0%, H$_2$ as remainder | |
| | E' | NH$_3$: 3.0%, AlCl$_3$: 0.5%, TiCl$_4$: 0.3%, N$_2$: 17%, C$_2$H$_4$: 0%, H$_2$ as remainder | |
| | F' | NH$_3$: 4.0%, H$_2$: 78%, | AlCl$_3$: 0.7%, TiCl$_4$: 0.3%, N$_2$: 3%, C$_2$H$_4$: 0.5%, H$_2$ as remainder |
| | G' | NH$_3$: 3.0%, H$_2$: 65%, | AlCl$_3$: 0.8%, TiCl$_4$: 0.1%, N$_2$: 0%, C$_2$H$_4$: 1.5%, H$_2$ as remainder |
| | H' | NH$_3$: 2.0%, H$_2$: 71%, | AlCl$_3$: 0.6%, TiCl$_4$: 0.5%, N$_2$: 9%, C$_2$H$_4$: 0%, H$_2$ as remainder |
| | I' | NH$_3$: 1.0%, AlCl$_3$: 0.9%, TiCl$_4$: 0.3%, N$_2$: 20%, C$_2$H$_4$: 0%, H$_2$ as remainder | |
| | J' | NH$_3$: 2.5%, AlCl$_3$: 1.2%, TiCl$_4$: 0.2%, N$_2$: 11%, C$_2$H$_4$: 1.0%, H$_2$ as remainder | |

(Note)
D', E', I', and J' indicate that gas is supplied under condition without a phase difference of any of the gas group A and the gas group B.

TABLE 7

Forming conditions (pressure of reaction atmosphere is expressed as kPa and temperature is expressed as ° C.)

| Formation of upper layer | | Gas group A | | Gas group B | | Phase difference in supply between gas group A and gas group B (sec) | Reaction atmosphere | |
|---|---|---|---|---|---|---|---|---|
| Process type | Formation symbol | Supply period (sec) | Supply time per one period (sec) | Supply period (sec) | Supply time per one period (sec) | | Pressure | Temperature |
| Present invention film forming process | A | 3.0 | 0.15 | 3.0 | 0.15 | 0.10 | 4.5 | 700 |
| | B | 4.0 | 0.25 | 4.0 | 0.25 | 0.15 | 5.0 | 750 |
| | C | 3.0 | 0.2 | 3.0 | 0.2 | 0.20 | 4.7 | 700 |
| | D | 3.5 | 0.2 | 3.5 | 0.2 | 0.15 | 4.5 | 730 |
| | E | 3.5 | 0.25 | 3.5 | 0.25 | 0.20 | 5.0 | 720 |
| | F | 3.0 | 0.15 | 3.0 | 0.15 | 0.10 | 4.5 | 700 |
| | G | 4.0 | 0.25 | 4.0 | 0.25 | 0.20 | 4.7 | 750 |
| Comparative film forming process | A' | 1.0 | 0.05 | 1.0 | 0.05 | 0.06 | 4.7 | 750 |
| | B' | 3.5 | 0.20 | 3.5 | 0.20 | 0.30 | 4.5 | 650 |
| | C' | 4.0 | 0.25 | 4.0 | 0.25 | 0.20 | 5.5 | 850 |
| | D' | — | — | — | — | — | 4 | 750 |
| | E' | — | — | — | — | — | 4.7 | 800 |
| | F' | 3.0 | 0.15 | 3.0 | 0.15 | 0.30 | 5 | 850 |
| | G' | 3.5 | 0.15 | 3.5 | 0.15 | 0.10 | 6 | 650 |

TABLE 7-continued

| | | Forming conditions (pressure of reaction atmosphere is expressed as kPa and temperature is expressed as °C.) | | | | | | |
|---|---|---|---|---|---|---|---|---|
| | | Gas group A | | Gas group B | | Phase difference | | |
| Formation of upper layer | | Supply | Supply time per | Supply | Supply time per | in supply between gas group A and | Reaction atmosphere | |
| Process type | Formation symbol | period (sec) | one period (sec) | period (sec) | one period (sec) | gas group B (sec) | Pressure | Temperature |
| | H' | 5.0 | 0.35 | 5.0 | 0.35 | 0.20 | 4.7 | 900 |
| | I' | — | — | — | — | — | 5 | 750 |
| | J' | — | — | — | — | — | 3.5 | 700 |

TABLE 8

| Type | Tool body symbol | Base layer (numerical value at the bottom indicates target average layer thickness (μm) of layer) | | Outermost surface layer (numerical value at the bottom indicates target average layer thickness (μm) of layer) | |
|---|---|---|---|---|---|
| | | First layer | Second layer | First layer | Second layer |
| Present invention coated tool, comparative coated tool | 1 A | — | — | — | — |
| | 2 B | — | — | — | — |
| | 3 C | — | — | — | — |
| | 4 D | TiN-① (0.3) | — | — | — |
| | 5 A | TiC (0.5) | — | — | — |
| | 6 B | TiN-② (0.5) | l-TiCN-① (1.0) | — | — |
| | 7 C | TiN-① (0.3) | l-TiCN-② (1.5) | TiN-② (0.3) | — |
| | 8 D | TiN-① (0.5) | l-TiCN-② (1.0) | TiCNO (0.5) | Al₂O₃ (1) |
| | 9 A | — | — | — | — |
| | 10 B | — | — | — | — |
| | 11 C | — | — | — | — |
| | 12 D | — | — | — | — |
| | 13 A | TiC (0.5) | — | — | — |
| | 14 B | TiN-② (0.5) | l-TiCN-① (1.0) | TiN-② (0.3) | — |
| | 15 C | — | — | TiCNO (0.5) | Al₂O₃ (1) |
| | 16 D | TiN-① (0.3) | — | l-TiCN-② (0.5) | Al₂O₃ (1) |
| | 17 A | — | — | — | — |
| | 18 B | — | — | — | — |
| | 19 C | — | — | — | — |
| | 20 D | TiN-① (0.5) | — | — | — |
| | 21 A | TiN-② (0.5) | l-TiCN-① (2.0) | TiN-② (0.3) | — |
| | 22 B | TiC (0.3) | — | TiCNO (0.5) | Al₂O₃ (1) |
| | 23 C | TiN-① (0.3) | l-TiCN-② (1.0) | l-TiCN-② (0.5) | Al₂O₃ (1) |
| | 24 D | — | — | — | — |
| | 25 A | — | — | — | — |

TABLE 9

| | | Lower layer | | | | | Upper layer | |
|---|---|---|---|---|---|---|---|---|
| Type | Tool body symbol | Film forming process formation symbol (see Tables 4 and 5) | Average Al amount $U_{avg}$ | Average C amount $V_{avg}$ | I(200)/ I(111) | Layer thickness (μm) | Film forming process formation symbol (see Tables 6 and 7) | Average Al amount $X_{avg}$ |
| Present invention coated tool | 1 | A | A1 | 0.47 | 0.0001 or less | 3.4 | 0.5 | A | 0.72 |
| | 2 | B | B1 | 0.54 | 0.0036 | 2.8 | 0.7 | B | 0.89 |
| | 3 | C | C1 | 0.22 | 0.0001 or less | 0.6 | 1.0 | C | 0.78 |
| | 4 | D | D1 | 0.01 or less | 0.0001 or less | 0.8 | 0.5 | D | 0.94 |
| | 5 | A | E1 | 0.62 | 0.0001 or less | 2.5 | 0.3 | E | 0.86 |
| | 6 | B | A1 | 0.49 | 0.0001 or less | 3.6 | 0.2 | F | 0.83 |
| | 7 | C | B1 | 0.52 | 0.0031 | 2.5 | 0.6 | G | 0.86 |

TABLE 9-continued

|   | | | | | | | | | |
|---|---|---|---|---|---|---|---|---|---|
| 8 | D | C1 | 0.25 | 0.0001 or less | 0.8 | 1.2 | A | 0.70 |
| 9 | A | D1 | 0.01 or less | 0.0001 or less | 1.0 | 0.8 | F | 0.82 |
| 10 | B | E1 | 0.64 | 0.0001 or less | 2.7 | 0.9 | G | 0.87 |

| Type | | Average C amount $Y_{avg}$ | I(200)/I(111) | Δx | Periods along <001> orientation (nm) | compositional change Xo in plane | Area proportion of hexagonal fine crystal grains (% by area) | Average grain size R of hexagonal fine crystal grains (μm) | Total layer thickness (μm) |
|---|---|---|---|---|---|---|---|---|---|
| Present invention coated tool | 1 | 0.0001 or less | 5.8 | 0.08 | 28 | 0.01 or less | 6 | 0.08 | 5.0 |
| | 2 | 0.0001 or less | 12.7 | 0.27 | 94 | 0.05 | 1 | 0.22 | 4.5 |
| | 3 | 0.0045 | 11.3 | 0.13 | 5 | 0.01 or less | 0 | — | 5.5 |
| | 4 | 0.0001 or less | 7.1 | 0.29 | — | — | 2 | 0.14 | 3.5 |
| | 5 | 0.0033 | 13.3 | 0.16 | 53 | 0.03 | 4 | 0.05 | 4.0 |
| | 6 | 0.0001 or less | 10.9 | 0.22 | 38 | 0.01 or less | 3 | 0.18 | 3.0 |
| | 7 | 0.0001 or less | 11.5 | 0.02 | — | — | 9 | 0.38 | 3.0 |
| | 8 | 0.0001 or less | 6.2 | 0.06 | 33 | 0.01 or less | 7 | 0.10 | 3.5 |
| | 9 | 0.0001 or less | 10.7 | 0.20 | 43 | 0.01 or less | 2 | 0.15 | 4.5 |
| | 10 | 0.0001 or less | 11.3 | 0.01 | — | — | 8 | 0.34 | 5.0 |

TABLE 10

| Type | | Tool body symbol | Lower layer | | | | | Upper layer | |
|---|---|---|---|---|---|---|---|---|---|
| | | | Film forming process formation symbol (see Tables 4 and 5) | Average Al amount $U_{avg}$ | Average C amount $V_{avg}$ | I(200)/I(111) | Layer thickness (μm) | Film forming process formation symbol (see Tables 6 and 7) | Average Al amount $X_{avg}$ |
| Comparative coated tool | 1 | A | — | — | — | — | — | A' | 0.98* |
| | 2 | B | — | — | — | — | — | B' | 0.78 |
| | 3 | C | — | — | — | — | — | C' | 0.99* |
| | 4 | D | — | — | — | — | — | D' | 0.53* |
| | 5 | A | — | — | — | — | — | E' | 0.64* |
| | 6 | B | f1 | 0.83* | 0.0024 | 6.1 | 1.5 | F' | 0.73 |
| | 7 | C | h1 | 0.96* | 0.0001 or less | 2.1 | 1.1 | G' | 0.55* |
| | 8 | D | g1 | 0.01 or less | 0.0001 or less | 4.3 | 0.9 | H' | 0.99* |
| | 9 | A | i1 | 0.73* | 0.0063* | 5.8 | 1.3 | I' | 0.84 |
| | 10 | B | j1 | 0.76* | 0.0001 or less | 6.6 | 0.5 | J' | 0.97* |

| Type | | Average C amount $Y_{avg}$ | I(200)/I(111) | Δx | Periods along <001> orientation (nm) | compositional change Xo in plane | Area proportion of hexagonal fine crystal grains (% by area) | Average grain size R of hexagonal fine crystal grains (μm) | Total layer thickness (μm) |
|---|---|---|---|---|---|---|---|---|---|
| Comparative coated tool | 1 | 0.0001 or less | 2.4 | 0.01 | — | — | 65 | 0.17 | 5.0 |
| | 2 | 0.0083* | 1.2 | 0.15 | — | — | 16 | 0.27 | 4.5 |
| | 3 | 0.0036 | 0.6 | — | — | — | 96 | 0.43 | 5.5 |
| | 4 | 0.0001 or less | 4.7 | — | — | — | 24 | 0.006 | 3.5 |
| | 5 | 0.0001 or less | 3.6 | — | — | — | 33 | 0.02 | 4.0 |
| | 6 | 0.0024 | 5.7 | 0.07 | 126 | 0.01 or less | 4 | 0.18 | 3.0 |
| | 7 | 0.0001 or less | 4.4 | 0.04 | 54 | 0.01 or less | 2 | 0.16 | 3.0 |
| | 8 | 0.0131* | 0.4 | — | — | — | 89 | 0.21 | 3.5 |
| | 9 | 0.0001 or less | 0.5 | — | — | — | 46 | 0.05 | 4.5 |
| | 10 | 0.0075* | 1.4 | — | — | — | 85 | 0.04 | 5.0 |

[Note 1]
Mark * in boxes indicates a value beyond the range of the present invention.

[Note 2]
The period due to a change in concentration of Al was not observed, because no gas supply phase difference is obtained in the upper layers of comparative coated tools 4, 5, 9, and 10, and a proportion of hexagonal crystals is excessively large in the comparative coated tools 3 and 8, although a gas supply phase difference is obtained.

Next, in a state in which each of the various coated tools was clamped to a cutter tip end portion made of tool steel with a cutter diameter of 125 mm by a fixing tool, the present invention coated tools 1 to 10 and the comparative coated tools 1 to 10 were subjected to dry high-speed face milling, which is a type of alloy steel high-speed intermittent cutting, and a center-cut cutting test, which are described below, and the flank wear width of a cutting edge was measured.

Tool body: tungsten carbide-based cemented carbide, titanium carbonitride-based cermet Cutting test: dry high-speed face milling, center-cut cutting Work material: a block material with a width of 100 mm and a length of 400 mm of JIS SCM440

Rotational speed: 994 min$^{-1}$
Cutting speed: 390 m/min
Depth of cut: 1.5 mm
Feed per tooth: 0.1 mm/tooth
Cutting time: 8 minutes
(a typical cutting speed is 220 m/min)

The results thereof are shown in Table 15.

Example 2

Lower layers formed of (Ti,Al)(C,N) having a composition inclined structure in which the Al amount in the layer continuously increases from the tool body side towards the upper layer side, were deposited on the surfaces of the tool bodies A to C made of WC-based cemented carbide and the tool body D made of TiCN-based cermet produced in Example 1 through a thermal CVD method for a predetermined time using a chemical vapor deposition apparatus, under forming conditions A2 to C2 shown in Table 11. Specifically, immediately after starting the film forming, the lower layer is formed by continuously changing a gas flow rate of $AlCl_3$ and $TiCl_4$ while maintaining the total of an $AlCl_3$ gas flow rate and a $TiCl_4$ gas flow rate to be constant so that a proportion of the $AlCl_3$ gas flow rate with respect to the total of the $AlCl_3$ gas flow rate and the $TiCl_4$ gas flow rate increases.

Next, present invention coated tools 11 to 17 shown in Table 12 were produced by depositing an upper layer formed of (Ti,Al)(C,N) having a predetermined layer thickness on the surface of the lower layer, under the forming conditions A to C shown in Table 6 and Table 7.

In addition, the base layer and the outermost surface layer shown in Table 8 were formed on the present invention coated tools 13 to 16 under the forming conditions shown in Table 3.

Regarding the present invention coated tools 11 to 17, the layer thickness of each layer, the values of the average Al amount $U_{avg}$ and the average C amount $V_{avg}$ of the lower layer in a film forming initial stage (tool body side) and a film forming later stage (upper layer side), the values of the average Al amount $X_{avg}$ and the average C amount $Y_{avg}$ of the upper layer, the value of I(200)/I(111), the value of Δx, the value of Xo, the area proportion of fine crystal grains having a hexagonal structure, and the value of the average grain size R thereof were respectively obtained, in the same manner as in the case of Example 1.

The values of the average Al amount $U_{avg}$ and the average C amount $V_{avg}$ of the lower layer on the tool body side were measured at a point of a distance of ¼ of an average layer thickness of the lower layer on the upper layer side from an interface between the lower layer and the surface of the tool body or the base layer. In the same manner as described above, the values of the average Al amount $U_{avg}$ and the average C amount $V_{avg}$ of the lower layer on the upper layer side were measured at a point of a distance of ¼ of an average layer thickness of the lower layer on the lower layer side from an interface between the lower layer and the upper layer. In addition, the lower layer was observed using a transmission electron microscope (at a magnification of 200,000×) and the magnification was set so that the lower layer is in the measurement range from the cross section side using energy-dispersive X-ray spectroscopy (EDS). Then, the line analysis of the composition using EDS was performed along the normal direction of the surface of the tool body, and it was confirmed that the average Al amount continuously increases from the tool body side towards the upper layer side.

Table 12 shows the respective values obtained.

TABLE 11

| | | | Forming conditions (pressure of reaction atmosphere is expressed as kPa and temperature is expressed as ° C.) |
|---|---|---|---|
| | | | Reaction gas group A composition and reaction atmosphere pressure, temperature, supply period of gas groups A and B, supply time per one period, and phase difference of supply (see |
| Formation of lower layer | | | |
| Process type | Formation symbol | Tables 4 and 5) | Reaction gas group B composition |
| Present invention film forming process | A2 | Same as those in A1 | (when film forming starts) $AlCl_3$: 0.0%, $TiCl_4$: 0.7%, $N_2$: 0%, $C_2H_4$: 0.0%, $H_2$ as remainder (when film forming ends) $AlCl_3$: 0.6%, $TiCl_4$: 0.4%, $N_2$: 0%, $C_2H_4$: 0.0%, $H_2$ as remainder |
| | B2 | Same as those in B1 | (when film forming starts) $AlCl_3$: 0.2%, $TiCl_4$: 0.4%, $N_2$: 0%, $C_2H_4$: 0.5%, $H_2$ as remainder (when film forming ends) $AlCl_3$: 0.4%, $TiCl_4$: 0.3%, $N_2$: 0%, $C_2H_4$: 0.5%, $H_2$ as remainder |
| | C2 | Same as those in C1 | (when film forming starts) $AlCl_3$: 0.1%, $TiCl_4$: 0.5%, $N_2$: 2%, $C_2H_4$: 0.0%, $H_2$ as remainder |

TABLE 11-continued

Forming conditions (pressure of reaction atmosphere is expressed as kPa and temperature is expressed as ° C.)

| Formation of lower layer | | Reaction gas group A composition and reaction atmosphere pressure, temperature, supply period of gas groups A and B, supply time per one period, and phase difference of supply (see Tables 4 and 5) | |
|---|---|---|---|
| Process type | Formation symbol | | Reaction gas group B composition |
| | | | (when film forming ends) AlCl$_3$: 0.6%, TiCl$_4$: 0.3%, N$_2$: 2%, C$_2$H$_4$: 0.0%, H$_2$ as remainder |

(Note)
The lower layer having an inclined composition is formed by continuously changing the gas composition of AlCl$_3$ and TiCl$_4$ from the start of the film forming to the end of the film forming.

TABLE 12

| | | | Lower layer | | | | | | Upper layer |
|---|---|---|---|---|---|---|---|---|---|
| | | | Film forming process formation symbol (see Tables 4, 5, and 11) | Body side | | Upper layer side | | | Film forming process formation symbol (see Tables 6 and 7) |
| Type | | Tool body symbol | | Average Al amount U$_{avg}$ | Average C amount V$_{avg}$ | Average Al amount U$_{avg}$ | Average C amount V$_{avg}$ | I(200)/I(111) | Total layer thickness (µm) | |
| Present invention coated tool | 11 | C | A2 | 0.13 | 0.0001 or less | 0.43 | 0.0001 or less | 2.4 | 1.0 | A |
| | 12 | D | B2 | 0.42 | 0.0035 | 0.49 | 0.0033 | 4.0 | 0.7 | B |
| | 13 | A | C2 | 0.30 | 0.0001 or less | 0.57 | 0.0001 or less | 2.7 | 1.2 | C |
| | 14 | B | A2 | 0.15 | 0.0001 or less | 0.46 | 0.0001 or less | 2.6 | 1.0 | B |
| | 15 | C | B2 | 0.40 | 0.0039 | 0.52 | 0.0037 | 3.4 | 1.3 | C |
| | 16 | D | C2 | 0.27 | 0.0001 or less | 0.55 | 0.0001 or less | 2.8 | 0.6 | A |
| | 17 | A | A2 | 0.16 | 0.0001 or less | 0.44 | 0.0001 or less | 2.4 | 1.5 | C |

| | | Upper layer | | | | | | | | |
|---|---|---|---|---|---|---|---|---|---|---|
| Type | | Average Al amount X$_{avg}$ | Average C amount Y$_{avg}$ | I(200)/I(111) | Δx | Periods along <001> orientation (nm) | compositional change Xo in plane | Area proportion of hexagonal fine crystal grains (% by area) | Average grain size R of hexagonal fine crystal grains (µm) | Total layer thickness (µm) |
| Present invention coated tool | 11 | 0.74 | 0.0001 or less | 5.3 | 0.09 | 33 | 0.01 or less | 7 | 0.10 | 3.5 |
| | 12 | 0.90 | 0.0001 or less | 13.0 | 0.28 | 97 | 0.04 | 2 | 0.25 | 4.0 |
| | 13 | 0.77 | 0.0048 | 11.7 | 0.11 | 8 | 0.01 or less | 0 | — | 3.5 |
| | 14 | 0.92 | 0.0001 or less | 12.7 | 0.26 | 91 | 0.06 | 3 | 0.23 | 4.0 |
| | 15 | 0.79 | 0.0045 | 11.1 | 0.15 | 10 | 0.01 or less | 0 | — | 3.5 |
| | 16 | 0.73 | 0.0001 or less | 5.7 | 0.07 | 36 | 0.01 or less | 8 | 0.11 | 3.0 |
| | 17 | 0.75 | 0.0001 or less | 12.2 | 0.14 | 8 | 0.01 or less | 0 | — | 5.0 |

The present invention coated tools 11 to 17 were subjected to dry high-speed face milling and a center-cut cutting test under the following cutting conditions which are the same as in the case of Example 1, and the flank wear width of a cutting edge was measured.

Tool body: tungsten carbide-based cemented carbide, titanium carbonitride-based cermet
Cutting test: dry high-speed face milling, center-cut cutting
Work material: a block material with a width of 100 mm and a length of 400 mm of JIS SCM440
Rotational speed: 994 $min^{-1}$
Cutting speed: 390 m/min
Depth of cut: 1.5 mm
Feed per tooth: 0.1 mm/tooth
Cutting time: 8 minutes
(a typical cutting speed is 220 m/min)
The results of the cutting test are shown in Table 15.

Example 3

Lower layers formed of (Ti,Al)(C,N) were deposited on the surfaces of the tool bodies A to C made of WC-based cemented carbide and the tool body D made of TiCN-based cermet produced in Example 1 through a thermal CVD method for a predetermined time using a chemical vapor deposition apparatus, under forming conditions A3 to C3 shown in Table 13.

Here, the lower layer is formed to have a layered structure including a plurality of layers of a first lower layer on the tool body side, a second lower layer substantially positioned at the center, and a third lower layer on the upper layer side, Al concentration is substantially constant in each layer, but the Al concentration of each layer stepwisely increases from the tool body side towards the upper layer side, from the first lower layer towards the third lower layer.

There is no limitation to the first to third lower layers, and the lower layer can have a configuration as a layered structure of n layers (here, n is integer of 2 or greater). In Example 3, the lower layer is formed to have a three-layer structure (n=3).

Next, present invention coated tools 18 to 25 shown in Table 14 were produced by depositing an upper layer formed of (Ti,Al)(C,N) having a predetermined layer thickness on the surface of the lower layer, under the forming conditions A, C, E, and G shown in Table 6 and Table 7.

In addition, the base layer and the outermost surface layer shown in Table 10 were formed on the present invention coated tools 20 to 23 under the forming conditions shown in Table 3.

Regarding the present invention coated tools 18 to 25, the layer thickness of each layer of the first lower layer, the second lower layer, the third lower layer, the base layer, and the upper layer, the values of the average Al amount $U_{avg}$ and the average C amount $V_{avg}$ of each layer of the lower layers, the values of the average Al amount $X_{avg}$ and the average C amount $Y_{avg}$ of the upper layer, the value of I(200)/I(111), the value of Δx, the value of Xo, the area proportion of fine crystal grains having a hexagonal structure, and the value of the average grain size R thereof were respectively obtained, in the same manner as in the case of Example 1 and Example 2.

Table 14 shows the respective values obtained.

TABLE 13

| | | Forming conditions (pressure of reaction atmosphere is expressed as kPa and temperature is expressed as ° C.) | |
|---|---|---|---|
| Process type | Formation symbol | Formation of lower layer Reaction gas group A composition and reaction atmosphere pressure, temperature, supply period of gas groups A and B, supply time per one period, and phase difference of supply (see Tables 4 and 5) | Reaction gas group B composition |
| Present invention film forming process | A3 | Same as those in A1 | (First layer) $AlCl_3$: 0.2%, $TiCl_4$: 0.5%, $N_2$: 8%, $C_2H_4$: 0.0%, $H_2$ as remainder<br>(Second layer) $AlCl_3$: 0.4%, $TiCl_4$: 0.4%, $N_2$: 8%, $C_2H_4$: 0.0%, $H_2$ as remainder<br>(Third layer) $AlCl_3$: 0.5%, $TiCl_4$: 0.3%, $N_2$: 8%, $C_2H_4$: 0.0%, $H_2$ as remainder |
| | B3 | Same as those in B1 | (First layer) $AlCl_3$: 0.0%, $TiCl_4$: 0.6%, $N_2$: 3%, $C_2H_4$: 0.0%, $H_2$ as remainder<br>(Second layer) $AlCl_3$: 0.2%, $TiCl_4$: 0.4%, $N_2$: 3%, $C_2H_4$: 0.0%, $H_2$ as remainder<br>(Third layer) $AlCl_3$: 0.3%, $TiCl_4$: 0.3%, $N_2$: 3%, $C_2H_4$: 0.0%, $H_2$ as remainder |
| | C3 | Same as those in C1 | (First layer) $AlCl_3$: 0.3%, $TiCl_4$: 0.4%, $N_2$: 0%, $C_2H_4$: 0.5%, $H_2$ as remainder<br>(Second layer) $AlCl_3$: 0.4%, $TiCl_4$: 0.3%, $N_2$: 0%, $C_2H_4$: 0.5%, $H_2$ as remainder<br>(Third layer) $AlCl_3$: 0.6%, $TiCl_4$: 0.3%, $N_2$: 0%, $C_2H_4$: 0.5%, $H_2$ as remainder |

TABLE 14

| | | | Lower layer | | | | | | | | |
|---|---|---|---|---|---|---|---|---|---|---|---|
| | | Film forming process formation symbol (see Tables 4, 5, and 13) | First layer | | Second layer | | Third layer | | | |
| Type | Tool body symbol | | Average Al amount $U_{avg}$ | Average C amount $V_{avg}$ | Average Al amount $U_{avg}$ | Average C amount $V_{avg}$ | Average Al amount $U_{avg}$ | Average C amount $V_{avg}$ | I(200)/ I(111) | Total layer thickness (μm) |
| Present invention coated tool | 18 | B | A3 | 0.35 | 0.0001 or less | 0.49 | 0.0001 or less | 0.62 | 0.0001 or less | 2.7 | 0.5 |
| | 19 | C | B3 | 0.01 or less | 0.0001 or less | 0.37 | 0.0001 or less | 0.50 | 0.0001 or less | 3.4 | 1.0 |
| | 20 | D | C3 | 0.38 | 0.0021 | 0.55 | 0.0018 | 0.68 | 0.0023 | 1.9 | 0.4 |
| | 21 | A | A3 | 0.33 | 0.0001 or less | 0.51 | 0.0001 or less | 0.63 | 0.0001 or less | 2.4 | 1.2 |
| | 22 | B | B3 | 0.01 or less | 0.0001 or less | 0.39 | 0.0001 or less | 0.52 | 0.0001 or less | 3.6 | 0.7 |
| | 23 | C | C3 | 0.39 | 0.0018 | 0.54 | 0.0016 | 0.67 | 0.0019 | 2.3 | 1.0 |
| | 24 | D | A3 | 0.32 | 0.0001 or less | 0.48 | 0.0001 or less | 0.60 | 0.0001 or less | 2.3 | 0.8 |
| | 25 | A | B3 | 0.01 or less | 0.0001 or less | 0.35 | 0.0001 or less | 0.51 | 0.0001 or less | 3.9 | 1.3 |

| | | Upper layer | | | | | | | | |
|---|---|---|---|---|---|---|---|---|---|---|
| Type | | Film forming process formation symbol (see Tables 6 and 7) | Average Al amount $X_{avg}$ | Average C amount $Y_{avg}$ | I(200)/ I(111) | Δx | Periods along <001> orientation (nm) | compositional change Xo in plane | Area proportion of hexagonal fine crystal grains (% by area) | Average grain size R of hexagonal fine crystal grains (μm) | Total layer thickness (μm) |
| Comparative coated tool | 18 | A | 0.73 | 0.0001 or less | 6.1 | 0.06 | 25 | 0.01 or less | 7 | 0.11 | 4.0 |
| | 19 | C | 0.77 | 0.0039 | 10.6 | 0.12 | 7 | 0.01 or less | 0 | — | 3.5 |
| | 20 | F | 0.81 | 0.0001 or less | 11.2 | 0.18 | 42 | 0.01 or less | 3 | 0.15 | 3.0 |
| | 21 | G | 0.82 | 0.0001 or less | 11.1 | 0.01 | — | — | 7 | 0.34 | 4.5 |
| | 22 | A | 0.71 | 0.0001 or less | 5.6 | 0.07 | 29 | 0.01 or less | 8 | 0.09 | 3.0 |
| | 23 | G | 0.84 | 0.0001 or less | 11.9 | 0.02 | — | — | 8 | 0.35 | 3.5 |
| | 24 | C | 0.76 | 0.0045 | 11.5 | 0.10 | 9 | 0.01 or less | 0 | — | 4.0 |
| | 25 | F | 0.79 | 0.0001 or less | 10.7 | 0.16 | 35 | 0.01 or less | 3 | 0.13 | 4.5 |

The present invention coated tools 18 to 25 were subjected to dry high-speed face milling and a center-cut cutting test under the following cutting conditions which are the same as in the case of Example 1 and Example 2, and the flank wear width of a cutting edge was measured.

Tool body: tungsten carbide-based cemented carbide, titanium carbonitride-based cermet
Cutting test: dry high-speed face milling, center-cut cutting Work material: a block material with a width of 100 mm and a length of 400 mm of JIS SCM440
Rotational speed: 993 min⁻¹
Cutting speed: 390 m/min
Depth of cut: 1.5 mm
Feed per tooth: 0.1 mm/tooth
Cutting time: 8 minutes
(a typical cutting speed is 220 m/min)
The results of the cutting test are shown in Table 15.

TABLE 15

| Type | | Flank wear width (mm) | Type | | Cutting test results (min) | Type | | Flank wear width (mm) | Type | | Flank wear width (mm) |
|---|---|---|---|---|---|---|---|---|---|---|---|
| Present invention coated tool | 1 | 0.18 | Comparative coated tool | 1 | 3.4* | Present invention coated tool | 11 | 0.11 | Present invention coated tool | 18 | 0.09 |
| | 2 | 0.15 | | 2 | 5.7* | | 12 | 0.14 | | 19 | 0.09 |
| | 3 | 0.09 | | 3 | 2.1* | | 13 | 0.07 | | 20 | 0.05 |
| | 4 | 0.19 | | 4 | 4.8* | | 14 | 0.11 | | 21 | 0.10 |
| | 5 | 0.10 | | 5 | 6.0* | | 15 | 0.08 | | 22 | 0.14 |
| | 6 | 0.11 | | 6 | 7.3* | | 16 | 0.10 | | 23 | 0.10 |
| | 7 | 0.15 | | 7 | 6.9* | | 17 | 0.07 | | 24 | 0.06 |
| | 8 | 0.13 | | 8 | 2.7* | | | | | 25 | 0.08 |
| | 9 | 0.08 | | 9 | 5.3* | | | | | | |
| | 10 | 0.14 | | 10 | 3.6* | | | | | | |

Mark * in boxes of comparative coated tools indicates a cutting time (min) until the end of a service life caused by the occurrence of chipping.

Example 4

As raw material powders, a WC powder, a TiC powder, a ZrC powder, a TaC powder, an NbC powder, a $Cr_3C_2$ powder, a TiN powder, and a Co powder, all of which had an average grain size of 1 to 3 μm, were prepared, and the raw material powders were mixed in mixing compositions shown in Table 16. Wax was further added thereto, and the mixture was blended in acetone by a ball mill for 24 hours and was decompressed and dried. Thereafter, the resultant was press-formed into green compacts having predetermined shapes at a pressure of 98 MPa, and the green compacts were sintered in a vacuum of 5 Pa at a predetermined temperature in a range of 1370° C. to 1470° C. for one hour. After the sintering, a cutting edge portion was subjected to honing to have a radius R of 0.07 mm, thereby forming tool bodies α to γ made of WC-based cemented carbide with insert shapes according to ISO standard CNMG120412.

In addition, as raw material powders, a TiCN (TiC/TiN=50/50 in terms of mass ratio) powder, an NbC powder, a WC powder, a Co powder, and an Ni powder, all of which had an average grain size of 0.5 to 2 μm, were prepared, and the raw material powders were mixed in mixing compositions shown in Table 17, were subjected to wet mixing by a ball mill for 24 hours, and were dried. Thereafter, the resultant was press-formed into green compacts at a pressure of 98 MPa, and the green compacts were sintered in a nitrogen atmosphere at 1.3 kPa at a temperature of 1500° C. for one hour. After the sintering, a cutting edge portion was subjected to honing to have a radius R of 0.09 mm, thereby forming a tool body δ made of TiCN-based cermet with an insert shape according to ISO standard CNMG120412.

Subsequently, present invention coated tools 26 to shown in Table 19 were produced by depositing lower layers under the conditions shown in Table 19 among the forming conditions A1 to E1 shown in Tables 4 and 5, and depositing upper layers under the conditions shown in Table 19 among the forming conditions A to G shown in Tables 6 and 7, on the surfaces of the tool bodies α to γ and the tool body δ using a typical chemical vapor deposition apparatus.

In addition, the base layer and the outermost surface layer shown in Table 18 were formed in the present invention coated tools 27 to 29 under the forming conditions shown in Table 3.

Regarding the present invention coated tools 26 to 30, the layer thickness of each layer, the values of the average Al amount $U_{avg}$ and the average C amount $V_{avg}$ of the lower layer, the values of the average Al amount $X_{avg}$ and the average C amount $Y_{avg}$ of the upper layer, the value of I(200)/I(111), the value of Δx, the value of Xo, the area proportion of fine crystal grains having a hexagonal structure, and the value of the average grain size R thereof were respectively obtained, in the same manner as in the case of Example 1.

Table 19 shows the respective values obtained.

Present invention coated tools 31 to 35 shown in Table 20 were produced by depositing lower layers under the forming conditions A2 to C2 shown in Tables 4 and 11, and depositing upper layers under the conditions shown in Table 20 among the forming conditions A to G shown in Tables 6 and 7, on the surfaces of the tool bodies α to γ and the tool body δ using a typical chemical vapor deposition apparatus.

In addition, the base layer and the outermost surface layer shown in Table 18 were formed in the present invention coated tools 32 to 34 under the forming conditions shown in Table 3.

Regarding the present invention coated tools 31 to 35, the layer thickness of each layer, the values of the average Al amount $U_{avg}$ and the average C amount $V_{avg}$ of the lower layer in a film forming initial stage (tool body side) and a film forming later stage (upper layer side), the values of the average Al amount $X_{avg}$ and the average C amount $Y_{avg}$ of the upper layer, the value of I(200)/I(111), the value of Δx, the value of Xo, the area proportion of fine crystal grains having a hexagonal structure, and the value of the average grain size R thereof were respectively obtained, in the same manner as in the case of Example 2.

Table 20 shows the respective values obtained.

Present invention coated tools 36 to 40 shown in Table 21 were produced by depositing lower layers under the forming conditions A3 to C3 shown in Tables 4 and 13, and depositing upper layers under the conditions shown in Table 21 among the forming conditions A to G shown in Tables 6 and 7, on the surfaces of the tool bodies α to γ and the tool body δ using a typical chemical vapor deposition apparatus.

In addition, the base layer and the outermost surface layer shown in Table 18 were formed in the present invention coated tools 37 to 39 under the forming conditions shown in Table 3.

Regarding the present invention coated tools 36 to 40, the layer thickness of each layer of the first lower layer, the second lower layer, the third lower layer, the base layer, and the upper layer, the values of the average Al amount $U_{avg}$ and the average C amount $V_{avg}$ of each layer of the lower layers, the values of the average Al amount $X_{avg}$ and the average C amount $Y_{avg}$ of the upper layer, the value of I(200)/I(111), the value of Δx, the value of Xo, the area proportion of fine crystal grains having a hexagonal structure, and the value of the average grain size R thereof were respectively obtained, in the same manner as in the case of Example 3.

Table 21 shows the respective values obtained.

TABLE 16

| Type | | Co | TiC | ZrC | TaC | NbC | $Cr_3C_2$ | TiN | WC |
|---|---|---|---|---|---|---|---|---|---|
| Tool body | α | 6.5 | — | 1.5 | — | 2.9 | 0.1 | 1.5 | Remainder |
| | β | 7.6 | 2.6 | — | 4.0 | 0.5 | — | 1.1 | Remainder |
| | γ | 6.0 | — | — | — | — | — | — | Remainder |

Mixing composition (mass %)

TABLE 17

| Type | | Co | Ni | NbC | WC | TiCN |
|---|---|---|---|---|---|---|
| Tool body | δ | 11 | 4 | 6 | 15 | Remainder |

Mixing composition (mass %)

TABLE 18

| Type | Tool body symbol | Base layer (numerical value at the bottom indicates target average layer thickness (μm) of the Layer) | | Outermost surface layer (numerical value at the bottom indicates target average layer thickness (μm) of the layer) | | | |
|---|---|---|---|---|---|---|---|
| | | First layer | Second layer | First layer | Second layer | Third layer | Fourth layer |
| Present invention coated tool | 26 | α | — | — | — | — | — | — |
| | 27 | β | TiN-① (0.5) | — | — | — | — | — |
| | 28 | γ | TiN-② (0.3) | 1-TiCN-① (7) | — | — | — | — |
| | 29 | δ | TiN-① (0.5) | 1-TiCN-② (5) | TiN-② (0.5) | TiCNO (0.5) | Al₂O₃ (4) | — |
| | 30 | α | — | — | — | — | — | — |
| | 31 | β | — | — | — | — | — | — |
| | 32 | γ | TiC (1) | — | TiN-② (0.7) | — | — | — |
| | 33 | δ | TiN-① (0.3) | 1-TiCN-② (8) | — | — | — | — |
| | 34 | α | TiN-② (0.5) | 1-TiCN-① (4) | TiN-② (0.3) | 1-TiCN-① (2.0) | TiCNO (0.5) | Al₂O₃ (5) |
| | 35 | β | — | — | — | — | — | — |
| | 36 | γ | — | — | — | — | — | — |
| | 37 | δ | TiN-① (0.7) | — | — | — | — | — |
| | 38 | α | TiN-① (0.3) | 1-TiCN-② (5) | TiN-① (0.5) | — | — | — |
| | 39 | β | TiN-② (0.5) | 1-TiCN-① (6) | TiN-② (0.3) | TiCNO (1.0) | Al₂O₃ (3) | — |
| | 40 | γ | — | — | — | — | — | — |

TABLE 19

| | | Lower layer | | | | | Upper layer | |
|---|---|---|---|---|---|---|---|---|
| Type | Tool body symbol | Film forming process formation symbol (see Tables 4 and 5) | Average Al amount $U_{avg}$ | Average C amount $V_{avg}$ | $I(200)/I(111)$ | Layer thickness (μm) | Film forming process formation symbol (see Tables 6 and 7) | Average Al amount $X_{avg}$ |
| Present invention coated tool | 26 | α | A1 | 0.45 | 0.0001 or less | 3.8 | 1.5 | A | 0.73 |
| | 27 | β | B1 | 0.53 | 0.0039 | 2.5 | 2.2 | B | 0.90 |
| | 28 | γ | C1 | 0.19 | 0.0001 or less | 0.4 | 1.3 | C | 0.77 |
| | 29 | δ | D1 | 0.01 or less | 0.0001 or less | 0.9 | 0.7 | D | 0.92 |
| | 30 | α | E1 | 0.64 | 0.0001 or less | 2.7 | 1.8 | E | 0.86 |

| | | Upper layer | | | | | | |
|---|---|---|---|---|---|---|---|---|
| Type | | Average C amount $Y_{avg}$ | $I(200)/I(111)$ | Δx | Periods along <001> orientation (nm) | compositional change Xo in plane | Area proportion of hexagonal fine crystal grains (% by area) | Average grain size R of hexagonal fine crystal grains (μm) | Total layer thickness (μm) |
| Present invention coated tool | 26 | 0.0001 or less | 6.9 | 0.07 | 25 | 0.01 or less | 8 | 0.11 | 12 |
| | 27 | 0.0001 or less | 12.3 | 0.29 | 98 | 0.04 | 2 | 0.21 | 15 |
| | 28 | 0.0036 | 11.7 | 0.14 | 6 | 0.01 or less | 0 | — | 10 |
| | 29 | 0.0001 or less | 8.4 | 0.31 | — | — | 3 | 0.12 | 13 |
| | 30 | 0.0025 | 13.9 | 0.18 | 61 | 0.02 | 3 | 0.06 | 9 |

TABLE 20

| Type | | Tool body symbol | Lower layer | | | | | | | Upper layer |
|---|---|---|---|---|---|---|---|---|---|---|
| | | | Film forming process formation symbol (see Tables 4, 5, and 11) | Body side | | Upper layer side | | | | Film forming process formation symbol (see Tables 6 and 7) |
| | | | | Average Al amount $U_{avg}$ | Average C amount $V_{avg}$ | Average Al amount $U_{avg}$ | Average C amount $V_{avg}$ | I(200)/I(111) | Total layer thickness (μm) | |
| Present invention coated tool | 31 | β | A2 | 0.15 | 0.0001 or less | 0.47 | 0.0001 or less | 2.7 | 1.5 | F |
| | 32 | γ | B2 | 0.39 | 0.0040 | 0.50 | 0.0037 | 3.6 | 1.0 | G |
| | 33 | δ | C2 | 0.31 | 0.0001 or less | 0.61 | 0.0001 or less | 2.5 | 1.8 | A |
| | 34 | α | A2 | 0.17 | 0.0001 or less | 0.45 | 0.0001 or less | 1.8 | 2.5 | B |
| | 35 | β | B2 | 0.33 | 0.0001 or less | 0.42 | 0.0001 or less | 3.1 | 1.5 | C |

| Type | | Upper layer | | | | | | | | |
|---|---|---|---|---|---|---|---|---|---|---|
| | | Average Al amount $X_{avg}$ | Average C amount $Y_{avg}$ | I(200)/I(111) | Δx | Periods along <001> orientation (nm) | compositional change Xo in plane | Area proportion of hexagonal fine crystal grains (% by area) | Average grain size R of hexagonal fine crystal grains (μm) | Total layer thickness (μm) |
| Present invention coated tool | 31 | 0.82 | 0.0001 or less | 11.7 | 0.24 | 34 | 0.01 or less | 4 | 0.16 | 14 |
| | 32 | 0.84 | 0.0001 or less | 12.7 | 0.01 | — | — | 10 | 0.35 | 16 |
| | 33 | 0.71 | 0.0001 or less | 6.7 | 0.05 | 37 | 0.01 or less | 8 | 0.11 | 8 |
| | 34 | 0.93 | 0.0001 or less | 12.7 | 0.29 | 94 | 0.03 | 1 | 0.19 | 10 |
| | 35 | 0.77 | 0.0037 | 12.3 | 0.12 | 8 | 0.01 or less | 0 | — | 11 |

TABLE 21

| Type | | Tool body symbol | Lower layer | | | | | | | |
|---|---|---|---|---|---|---|---|---|---|---|
| | | | Film forming process formation symbol (see Tables 4, 5, and 13) | First layer | | Second layer | | Third layer | | |
| | | | | Average Al amount $U_{avg}$ | Average C amount $V_{avg}$ | Average Al amount $U_{avg}$ | Average C amount $V_{avg}$ | Average Al amount $U_{avg}$ | Average C amount $V_{avg}$ | I(200)/I(111) | Total layer thickness (μm) |
| Present invention coated tool | 36 | γ | A3 | 0.34 | 0.0013 | 0.48 | 0.0014 | 0.61 | 0.0012 | 2.4 | 1.5 |
| | 37 | δ | B3 | 0.01 or less | 0.0001 or less | 0.38 | 0.0001 or less | 0.52 | 0.0001 or less | 3.7 | 1.8 |
| | 38 | α | C3 | 0.46 | 0.0023 | 0.54 | 0.0025 | 0.68 | 0.0025 | 3.9 | 1.0 |
| | 39 | β | B3 | 0.01 or less | 0.0001 or less | 0.31 | 0.0001 or less | 0.40 | 0.0001 or less | 1.7 | 0.7 |
| | 40 | γ | C3 | 0.19 | 0.0001 or less | 0.29 | 0.0001 or less | 0.34 | 0.0001 or less | 2.7 | 1.3 |

| Type | | Upper layer | | | | | | | | |
|---|---|---|---|---|---|---|---|---|---|---|
| | | Film forming process formation symbol (see Tables 6 and 7) | Average Al amount $X_{avg}$ | Average C amount $Y_{avg}$ | I(200)/I(111) | Δx | Periods along <001> orientation (nm) | compositional change Xo in plane | Area proportion of hexagonal fine crystal grains (% by area) | Average grain size R of hexagonal fine crystal grains (μm) | Total layer thickness (μm) |
| Comparative coated tool | 36 | D | 0.93 | 0.0001 or less | 7.5 | 0.27 | — | — | 3 | 0.12 | 11 |
| | 37 | E | 0.85 | 0.0027 | 12.8 | 0.18 | 55 | 0.02 | 5 | 0.07 | 9 |
| | 38 | F | 0.82 | 0.0001 or less | 10.7 | 0.21 | 41 | 0.01 or less | 2 | 0.16 | 7 |
| | 39 | G | 0.87 | 0.0001 or less | 11.2 | 0.01 | — | — | 10 | 0.39 | 10 |
| | 40 | A | 0.72 | 0.0001 or less | 5.9 | 0.07 | 32 | 0.01 or less | 10 | 0.12 | 14 |

Next, in a state in which each of the various coated tools was screwed to a tip end portion of an insert holder made of tool steel by a fixing tool, the present invention coated tools 26 to 40 were subjected to a dry high-speed intermittent cutting test for carbon steel and a wet high-speed intermittent cutting test for cast iron, which are described below, and the flank wear width of a cutting edge was measured.

Cutting conditions 1:
Work material: a round bar with four longitudinal grooves formed at equal intervals in the longitudinal direction of JIS S45C
Cutting speed: 390 m/min
Depth of cut: 1.5 mm
Feed rate: 0.1 mm/rev
Cutting time: 5 minutes
(a typical cutting speed is 220 m/min)
Cutting conditions 2:
Work material: a round bar with four longitudinal grooves formed at equal intervals in the longitudinal direction of JIS FCD700
Cutting speed: 325 m/min
Depth of cut: 1.0 mm
Feed rate: 0.25 mm/rev
Cutting time: 5 minutes
(a typical cutting speed is 180 m/min)
The results of the cutting test are shown in Table 22.

TABLE 22

| Type | | Flank wear width (mm) | |
|---|---|---|---|
| | | Cutting conditions 1 | Cutting conditions 2 |
| Present invention coated tool | 26 | 0.19 | 0.18 |
| | 27 | 0.16 | 0.17 |
| | 28 | 0.15 | 0.14 |
| | 29 | 0.18 | 0.18 |
| | 30 | 0.16 | 0.15 |
| | 31 | 0.08 | 0.07 |
| | 32 | 0.15 | 0.14 |
| | 33 | 0.13 | 0.12 |
| | 34 | 0.11 | 0.10 |
| | 35 | 0.12 | 0.13 |
| | 36 | 0.15 | 0.16 |
| | 37 | 0.14 | 0.14 |
| | 38 | 0.09 | 0.08 |
| | 39 | 0.13 | 0.12 |
| | 40 | 0.11 | 0.10 |

Example 5

As raw material powders, a cBN powder, a TiN powder, a TiC powder, an Al powder, and an $Al_2O_3$ powder, all of which had an average grain size of 0.5 to 4 μm, were prepared, and the raw material powders were mixed in mixing compositions shown in Table 23. The mixture was wet-blended by a ball mill for 80 hours and was dried. Thereafter, the resultant was press-formed into green compacts having dimensions with a diameter of 50 mm and a thickness of 1.5 mm at a pressure of 120 MPa, and the green compacts were then sintered in a vacuum at a pressure of 1 Pa at a predetermined temperature in a range of 900° C. to 1300° C. for 60 minutes, thereby producing cutting edge preliminary sintered bodies. In a state in which the preliminary sintered body was superimposed on a support piece made of WC-based cemented carbide, which was additionally prepared to contain Co: 8 mass % and WC: the remainder and have dimensions with a diameter of 50 mm and a thickness of 2 mm, the resultant was loaded in a typical ultrahigh-pressure sintering apparatus, and was subjected to ultrahigh-pressure sintering under typical conditions including a pressure of 4 GPa, a predetermined temperature in a range of 1200° C. to 1400° C., and a holding time of 0.8 hours. After the sintering, upper and lower surfaces were polished using a diamond grinding wheel, and were split into predetermined dimensions by a wire electric discharge machining apparatus. Furthermore, the resultant was brazed to a brazing portion (corner portion) of an insert body made of WC-based cemented carbide having a composition including Co: 5 mass %, TaC: 5 mass %, and WC: the remainder and a shape (a 80° rhombic shape with a thickness of 4.76 mm and an inscribed circle diameter of 12.7 mm) according to JIS standard CNGA120412 using a brazing filler metal made of a Ti—Zr—Cu alloy having a composition including Zr: 37.5%, Cu: 25%, and Ti: the remainder in terms of mass %, and the outer circumference thereof was machined into predetermined dimensions. Thereafter, a cutting edge portion was subjected to honing to have a width of 0.13 mm and an angle of 25°, and the resultant was further subjected to finish polishing, thereby producing each of tool bodies a and b with an insert shape according to ISO standard CNGA120412.

Subsequently, present invention coated tools 41 to 44 shown in Table 25 were produced by depositing lower layers under the conditions shown in Table 25 among the forming conditions A1 to E1 shown in Tables 4 and 5, and depositing upper layers under the conditions shown in Table 25 among the forming conditions A to G shown in Tables 6 and 7, on the surfaces of the tool bodies a and b using a typical chemical vapor deposition apparatus.

In addition, the base layer and the outermost surface layer shown in Table 24 were formed in the present invention coated tools 42 to 43 under the forming conditions shown in Table 3.

Regarding the present invention coated tools 41 to 44, the layer thickness of each layer, the values of the average Al amount $U_{avg}$ and the average C amount $V_{avg}$ of the lower layer, the values of the average Al amount $X_{avg}$ and the average C amount $Y_{avg}$ of the upper layer, the value of I(200)/I(111), the value of Δx, the value of Xo, the area proportion of fine crystal grains having a hexagonal structure, and the value of the average grain size R thereof were respectively obtained, in the same manner as in the case of Example 1.

Table 25 shows the respective values obtained.

Present invention coated tools 45 to 47 shown in Table 26 were produced by depositing lower layers under the conditions shown in Table 26 among the forming conditions A2 to C2 shown in Tables 4 and 5, and depositing upper layers under the conditions shown in Table 26 among the forming conditions A to G shown in Tables 6 and 7, on the surfaces of the tool bodies a and b using a typical chemical vapor deposition apparatus.

In addition, the base layer and the outermost surface layer shown in Table 24 were formed in the present invention coated tool 46 under the forming conditions shown in Table 3.

Regarding the present invention coated tools 45 to 47, the layer thickness of each layer, the values of the average Al amount $U_{avg}$ and the average C amount $V_{avg}$ of the lower layer in a film forming initial stage (tool body side) and a film forming later stage (upper layer side), the values of the average Al amount $X_{avg}$ and the average C amount $Y_{avg}$ of the upper layer, the value of I(200)/I(111), the value of Δx, the value of Xo, the area proportion of fine crystal grains having a hexagonal structure, and the value of the average grain size R thereof were respectively obtained, in the same manner as in the case of Example 2.

Table 26 shows the respective values obtained.

Present invention coated tools 48 to 50 shown in Table 27 were produced by depositing lower layers under the conditions shown in Table 27 among the forming conditions A3 to C3 shown in Tables 4 and 5, and depositing upper layers under the conditions shown in Table 27 among the forming conditions A to G shown in Tables 6 and 7, on the surfaces of the tool bodies a and b using a typical chemical vapor deposition apparatus.

In addition, the base layer and the outermost surface layer shown in Table 24 were formed in the present invention coated tool 49 under the forming conditions shown in Table 3.

Regarding the present invention coated tools 48 to 50, the layer thickness of each layer of the first lower layer, the second lower layer, the third lower layer, the base layer, and the upper layer, the values of the average Al amount $U_{avg}$ and the average C amount $V_{avg}$ of each layer of the lower layers, the values of the average Al amount $X_{avg}$ and the average C amount $Y_{avg}$ of the upper layer, the value of $I(200)/I(111)$, the value of $\Delta x$, the value of Xo, the area proportion of fine crystal grains having a hexagonal structure, and the value of the average grain size R thereof were respectively obtained, in the same manner as in the case of Example 3.

Table 27 shows the respective values obtained.

TABLE 23

| Type | Mixing composition (mass %) | | | | |
|------|-----|-----|-----|-----|-----|
| | TiN | TiC | Al | $Al_2O_3$ | cBN |
| Tool body | a | 50 | — | 5 | 3 | Remainder |
| | b | — | 50 | 4 | 3 | Remainder |

TABLE 24

| Type | Tool body symbol | Base layer (numerical value at the bottom indicates target average layer thickness (μm) of the layer) | | Outermost surface layer (numerical value at the bottom indicates target average layer thickness (μm) of the layer) |
|------|------|------|------|------|
| | | First layer | Second layer | |
| Present invention coated tool | 41 a | — | — | — |
| | 42 b | TiN-① (0.2) | l-TiCN-② (0.5) | — |
| | 43 a | TiN-① (0.2) | — | TiN-① (0.3) |
| | 44 b | — | — | — |
| | 45 a | — | — | — |
| | 46 b | TiN-① (0.3) | — | — |
| | 47 a | — | — | — |
| | 48 b | — | — | — |
| | 49 a | TiN-① (0.1) | — | TiN-① (0.2) |
| | 50 b | — | — | — |

TABLE 25

| Type | Tool body symbol | Lower layer | | | | | Upper layer | | |
|------|------|------|------|------|------|------|------|------|------|
| | | Film forming process formation symbol (see Tables 4 and 5) | Average Al amount $U_{avg}$ | Average C amount $V_{avg}$ | $I(200)/I(111)$ | Layer thickness (μm) | Film forming process formation symbol (see Tables 6 and 7) | Average Al amount $X_{avg}$ | |
| Present invention coated tool | 41 a | A1 | 0.23 | 0.0001 or less | 0.9 | 0.3 | A | 0.73 | |
| | 42 b | B1 | 0.01 or less | 0.0001 or less | 1.3 | 0.2 | B | 0.90 | |
| | 43 a | C1 | 0.36 | 0.0018 | 1.9 | 0.4 | C | 0.77 | |
| | 44 b | D1 | 0.50 | 0.0001 or less | 4.1 | 0.3 | D | 0.95 | |

| Type | | Upper layer | | | | | | |
|------|------|------|------|------|------|------|------|------|
| | | Average C amount $Y_{avg}$ | $I(200)/I(111)$ | $\Delta x$ | Periods along <001> orientation (nm) | compositional change Xo in plane | Area proportion of hexagonal fine crystal grains (% by area) | Average grain size R of hexagonal fine crystal grains (μm) | Total layer thickness (μm) |
| Present invention coated tool | 41 | 0.0001 or less | 4.9 | 0.07 | 25 | 0.01 or less | 7 | 0.11 | 1.5 |
| | 42 | 0.0001 or less | 11.8 | 0.26 | 89 | 0.04 | 1 | 0.19 | 1.0 |
| | 43 | 0.0040 | 10.9 | 0.12 | 7 | 0.01 or less | 0 | — | 2.0 |
| | 44 | 0.0001 or less | 5.9 | 0.30 | — | — | 3 | 0.15 | 1.5 |

TABLE 26

| | | Lower layer | | | | | | | Upper layer |
|---|---|---|---|---|---|---|---|---|---|
| | | Film forming process formation | Body side | | Upper layer side | | | | Film forming process formation |
| Type | Tool body symbol | symbol (see Tables 4, 5, and 11) | Average Al amount $U_{avg}$ | Average C amount $V_{avg}$ | Average Al amount $U_{avg}$ | Average C amount $V_{avg}$ | I(200)/I(111) | Total layer thickness (μm) | symbol (see Tables 6 and 7) |
| Present invention coated tool | 45 | a | A2 | 0.40 | 0.0031 | 0.51 | 0.0034 | 3.6 | 0.5 | E |
| | 46 | b | B2 | 0.37 | 0.0001 or less | 0.54 | 0.0001 or less | 2.3 | 0.4 | F |
| | 47 | a | C2 | 0.16 | 0.0001 or less | 0.48 | 0.0001 or less | 1.8 | 0.4 | G |

| | | Upper layer | | | | | | | |
|---|---|---|---|---|---|---|---|---|---|
| Type | | Average Al amount $X_{avg}$ | Average C amount $Y_{avg}$ | I(200)/I(111) | Δx | Periods along <001> orientation (nm) | compositional change Xo in plane | Area proportion of hexagonal fine crystal grains (% by area) | Average grain size R of hexagonal fine crystal grains (μm) | Total layer thickness (μm) |
| Present invention coated tool | 45 | 0.87 | 0.0038 | 12.7 | 0.15 | 57 | 0.04 | 4 | 0.07 | 1.5 |
| | 46 | 0.82 | 0.0001 or less | 10.3 | 0.21 | 40 | 0.01 or less | 2 | 0.14 | 1.5 |
| | 47 | 0.86 | 0.0001 or less | 11.9 | 0.02 | — | — | 10 | 0.36 | 2.0 |

TABLE 27

| | | Lower layer | | | | | | | | |
|---|---|---|---|---|---|---|---|---|---|---|
| | | Film forming process formation | First layer | | Second layer | | Third layer | | | |
| Type | Tool body symbol | symbol (see Tables 4, 5, and 13) | Average Al amount $U_{avg}$ | Average C amount $V_{avg}$ | Average Al amount $U_{avg}$ | Average C amount $V_{avg}$ | Average Al amount $U_{avg}$ | Average C amount $V_{avg}$ | I(200)/I(111) | Total layer thickness (μm) |
| Present invention coated tool | 48 | b | A3 | 0.32 | 0.0013 | 0.52 | 0.0014 | 0.61 | 0.0016 | 2.5 | 0.6 |
| | 49 | a | B3 | 0.01 or less | 0.0001 or less | 0.35 | 0.0001 or less | 0.51 | 0.0001 or less | 3.7 | 0.5 |
| | 50 | b | C3 | 0.01 or less | 0.0001 or less | 0.31 | 0.0001 or less | 0.42 | 0.0001 or less | 2.0 | 0.6 |

| | | Upper layer | | | | | | | | |
|---|---|---|---|---|---|---|---|---|---|---|
| Type | | Film forming process formation symbol (see Tables 6 and 7) | Average Al amount $X_{avg}$ | Average C amount $Y_{avg}$ | I(200)/I(111) | Δx | Periods along <001> orientation (nm) | compositional change Xo in plane | Area proportion of hexagonal fine crystal grains (% by area) | Average grain size R of hexagonal fine crystal grains (μm) | Total layer thickness (μm) |
| Present invention coated tool | 48 | A | 0.71 | 0.0001 or less | 5.0 | 0.07 | 37 | 0.01 or less | 8 | 0.11 | 2.0 |
| | 49 | E | 0.85 | 0.0027 | 12.4 | 0.17 | 50 | 0.04 | 3 | 0.04 | 1.5 |
| | 50 | G | 0.79 | 0.0001 or less | 11.9 | 0.01 | — | — | 8 | 0.35 | 2.0 |

Next, in a state in which each of the various coated tools was screwed to a tip end portion of an insert holder made of tool steel by a fixing tool, the present invention coated tools 41 to 50 were subjected to a dry high-speed intermittent cutting test for carburized alloy steel, which is described below, and the flank wear width of a cutting edge was measured.

Tool body: cubic boron nitride-based ultrahigh-pressure sintered body

Cutting test: dry high-speed intermittent cutting test for carburized alloy steel Work material: a round bar with four longitudinal grooves formed at equal intervals in the longitudinal direction of JIS SCr420 (hardness HRC60)

Cutting speed: 260 m/min
Depth of cut: 0.1 mm
Feed rate: 0.12 mm/rev
Cutting time: 4 minutes The results of the cutting test are shown in Table 28.

TABLE 28

| Type | | Flank wear width (mm) |
|---|---|---|
| Present invention coated tool | 41 | 0.11 |
| | 42 | 0.12 |
| | 43 | 0.10 |
| | 44 | 0.14 |
| | 45 | 0.11 |
| | 46 | 0.05 |
| | 47 | 0.09 |
| | 48 | 0.10 |
| | 49 | 0.09 |
| | 50 | 0.09 |

From the results shown in Tables 15, 22, and 28, in the coated tools of the invention, the (Ti,Al)(C,N) layer configuring the hard coating layer is formed of the upper layer having a relatively high Al amount and the lower layer having a relatively low Al amount, and the periodic compositional variation is formed in the (Ti,Al)(C,N) crystal grains of the upper layer having an NaCl type face-centered cubic structure. Thus, the hard coating layer has excellent toughness and wear resistance, and therefore, even in a case of being provided for high-speed intermittent cutting work of carbon steel, cast iron, alloy steel or the like, excellent chipping resistance and wear resistance are exhibited.

Contrary to this, it is apparent that coated tools in which the (Ti,Al)(C,N) layer configuring the hard coating layer is not configured with the upper layer having a relatively high Al amount and the lower layer having a relatively low Al amount, or comparative coated tools 1 to 10 in which the periodic compositional variation is not formed in the (Ti,Al)(C,N) crystal grains of the upper layer having an NaCl type face-centered cubic structure, generate high-temperature heat in a case of being used for high-speed intermittent cutting work during which intermittent and impact loads are exerted on a cutting edge, resulting in the end of the service life within a short period of time due to occurrence of chipping, fracture, and the like.

INDUSTRIAL APPLICABILITY

As described above, the coated tool of the present invention can be used as a coated tool for high-speed intermittent cutting work of various work materials and further exhibits excellent chipping resistance and wear resistance during long-term use, thereby sufficiently satisfying an improvement in performance of a cutting device, power saving and energy saving during cutting work, and a further reduction in costs.

The invention claimed is:

1. A surface-coated cutting tool comprising:
 a tool body, wherein
 a hard coating layer is formed on a surface of the tool body made of any of tungsten carbide-based cemented carbide, titanium carbonitride-based cermet, and a cubic boron nitride-based ultrahigh-pressure sintered body,
 (a) the hard coating layer includes at least a layer of a complex nitride or complex carbonitride of Ti and Al, having an average layer thickness of 1 to 20 μm,
 (b) the layer of a complex nitride or complex carbonitride includes at least a phase of a complex nitride or complex carbonitride having an NaCl type face-centered cubic structure,
 (c) the layer of a complex nitride or complex carbonitride includes at least an upper layer in which a periodic compositional variation in Ti and Al is present in crystal grains having an NaCl type face-centered cubic structure, and a lower layer in which a periodic compositional variation in Ti and Al is not present in crystal grains having an NaCl type face-centered cubic structure,
 (d) in a case where the upper layer is expressed by the composition formula: $(Ti_{1-x}Al_x)(C_yN_{1-y})$, an average amount $X_{avg}$ of Al in the total amount of Ti and Al and an average amount $Y_{avg}$ of C in the total amount of C and N (where both $X_{avg}$ and $Y_{avg}$ are atomic ratios) respectively satisfy $0.70 \leq X_{avg} \leq 0.95$ and $0 \leq Y_{avg} \leq 0.005$, and
 (e) in a case where the lower layer is expressed by the composition formula: $(Ti_{1-u}Al_u)(C_vN_{1-v})$, an average amount $U_{avg}$ of Al in the total amount of Ti and Al and an average amount $V_{avg}$ of C in the total amount of C and N (where both $U_{avg}$ and $V_{avg}$ are atomic ratios) respectively satisfy $0 \leq U_{avg} < 0.70$ and $0 \leq V_{avg} \leq 0.005$.

2. The surface-coated cutting tool according to claim 1, wherein, in a case where an X-ray diffraction peak intensity from a (200) plane of crystal grains of the upper layer having an NaCl type face-centered cubic structure is set as I(200) and an X-ray diffraction peak intensity from a (111) plane of crystal grains of the upper layer having an NaCl type face-centered cubic structure is set as I(111), I(200)/I(111)>10 is satisfied.

3. The surface-coated cutting tool according to claim 1, wherein, in a case where an X-ray diffraction peak intensity from a (200) plane of crystal grains of the lower layer having an NaCl type face-centered cubic structure is set as I(200) and an X-ray diffraction peak intensity from a (111) plane of crystal grains of the lower layer having an NaCl type face-centered cubic structure is set as I(111), I(200)/I(111)<3 is satisfied.

4. The surface-coated cutting tool according to claim 1, wherein
 a composition gradient is present in the lower layer, and an amount u of Al in the lower layer in the total amount of Ti and Al gradually increases from a tool body surface side towards an upper layer side.

5. The surface-coated cutting tool according to claim 1, wherein
 the lower layer is configured with a plurality of layers having different compositions, and
 an amount u of Al of each layer in the total amount of Ti and Al increases from a tool body side towards an upper layer side.

6. The surface-coated cutting tool according to claim 1, wherein, in the crystal grains of the upper layer having an NaCl type face-centered cubic structure in which a periodic compositional variation in Ti and Al is present, a difference Δx between the average of local maximums of x which varies periodically and the average of local minimums of x is 0.03 to 0.25.

7. The surface-coated cutting tool according to claim 1, wherein,
 in the crystal grains of the upper layer having an NaCl type face-centered cubic structure in which the periodic compositional variation in Ti and Al is present, the periodic compositional variation in Ti and Al is present along one orientation among the equivalent crystal orientations expressed by <001> of the crystal grains, a period along the orientation is 3 to 100 nm, and a change in an amount Xo of Al in a total amount of Ti and Al in a plane perpendicular to the orientation is 0.01 or less.

8. The surface-coated cutting tool according to claim 1, wherein, regarding the upper layer, in a case where the layer is observed in a longitudinal sectional direction, in grain boundaries of the crystal grains having an NaCl type face-centered cubic structure in the layer, fine crystal grains having a hexagonal structure are present, an area proportion of the fine crystal grains present is 5% or lower by area, and an average grain size R of the fine crystal grains is 0.01 to 0.3 μm.

9. The surface-coated cutting tool according to claim 1, wherein, between the tool body and the lower layer, a base layer which is formed of a Ti compound layer that includes one layer or two or more layers of a Ti carbide layer, a Ti nitride layer, a Ti carbonitride layer, a Ti oxycarbide layer, and a Ti oxycarbonitride layer and has an average total layer thickness of 0.1 to 20 μm is present.

10. The surface-coated cutting tool according to claim 1, wherein an outermost surface layer which includes at least an aluminum oxide layer having an average total layer thickness of 1 to 25 μm is present on a surface of the upper layer.

\* \* \* \* \*